US010775431B2

(12) United States Patent
Miwa

(10) Patent No.: US 10,775,431 B2
(45) Date of Patent: Sep. 15, 2020

(54) SYSTEMS AND METHODS FOR DUTY CYCLE MEASUREMENT, ANALYSIS, AND COMPENSATION

(71) Applicant: SanDisk Technologies LLC, Plano, TX (US)

(72) Inventor: Hitoshi Miwa, Kanagawa (JP)

(73) Assignee: SanDisk Technologies LLC, Addison, TX (US)

( * ) Notice: Subject to any disclaimer, the term of this patent is extended or adjusted under 35 U.S.C. 154(b) by 456 days.

(21) Appl. No.: 15/636,589

(22) Filed: Jun. 28, 2017

(65) Prior Publication Data
US 2019/0004111 A1 Jan. 3, 2019

(51) Int. Cl.
G01R 31/317 (2006.01)
G01R 29/02 (2006.01)
G01R 25/00 (2006.01)
G01R 31/28 (2006.01)
H03K 5/26 (2006.01)
G01R 23/20 (2006.01)

(52) U.S. Cl.
CPC ....... G01R 31/31708 (2013.01); G01R 23/20 (2013.01); G01R 25/005 (2013.01); G01R 29/023 (2013.01); H03K 5/26 (2013.01); G01R 31/2882 (2013.01)

(58) Field of Classification Search
CPC . G01R 31/31708; G01R 27/20; G01R 25/005
See application file for complete search history.

(56) References Cited

U.S. PATENT DOCUMENTS

| 6,512,719 | B2 | 1/2003 | Fujisawa et al. |
| 6,556,471 | B2 | 4/2003 | Chappell et al. |
| 6,889,336 | B2 | 5/2005 | Schoenfeld |
| 7,003,686 | B2 | 2/2006 | Chua-Eoan et al. |
| 7,423,465 | B2 | 9/2008 | Gomm |
| 7,698,589 | B2 | 4/2010 | Huang |
| 7,760,556 | B2 | 7/2010 | Kang et al. |
| 7,940,103 | B2 | 5/2011 | Satoh et al. |
| 8,988,101 | B2 | 3/2015 | Song et al. |
| 9,564,185 | B1 | 2/2017 | Yanagidaira |
| 9,787,335 | B1* | 10/2017 | Jeong .................. H04B 1/0475 |
| 2003/0201806 | A1* | 10/2003 | Cho ........................ G06F 7/68 327/116 |

(Continued)

OTHER PUBLICATIONS

Jedec, et al., JEDEC Standard-DDR3 SDRAM Standard, JESD79-3D, Sep. 2009, JEDEC Solid State Technology Association, 220 pages.

(Continued)

Primary Examiner — Christopher E Mahoney
(74) Attorney, Agent, or Firm — Vierra Magen Marcus LLP

(57) ABSTRACT

A duty cycle measurement circuit obtains differential duty cycle measurements corresponding to the duty cycle of a signal at two or more different locations along a propagation path. The differential duty cycle measurements may include measurements of an input duty cycle and measurements of an output duty cycle. The duty cycle measurements may be acquired by use of duty-cycle-to-voltage converter circuitry. The duty cycle measurements may be used to determine a measure of the duty cycle deterioration of the propagation path, and an adjustment factor to compensate for the measured duty cycle deterioration.

20 Claims, 15 Drawing Sheets

(56) References Cited

U.S. PATENT DOCUMENTS

| | | | |
|---|---|---|---|
| 2005/0050375 A1 | 3/2005 | Novak et al. | |
| 2006/0044874 A1 | 3/2006 | Tokiwa | |
| 2006/0136153 A1* | 6/2006 | Liaw | G01R 31/31708 702/57 |
| 2007/0075792 A1* | 4/2007 | Liu | G01R 31/2856 331/57 |
| 2007/0100505 A1* | 5/2007 | Boerstler | G01R 29/02 700/296 |
| 2007/0290730 A1* | 12/2007 | Dai | H03K 5/1565 327/175 |
| 2008/0186068 A1* | 8/2008 | Heightley | H03K 5/1565 327/175 |
| 2011/0292708 A1 | 12/2011 | Kang et al. | |
| 2012/0106263 A1 | 5/2012 | Kim | |
| 2013/0049832 A1* | 2/2013 | Wong | H03K 3/017 327/159 |
| 2015/0084677 A1* | 3/2015 | Van De Graaff | H03L 7/00 327/155 |
| 2018/0115410 A1* | 4/2018 | Tajalli | H03L 7/0996 |

OTHER PUBLICATIONS

Jedec, et al., JEDEC Standard-Low Power Double Data Rate-4 (LPDDDR4), JESD209-4, Aug. 2014, JEDEC Solid State Technology Association, 196 pages.

Ross, Frank et al., Migrating to LPDDR3: An Overview of LPDDR3 Commands, Operations, and Functions, LPDDR3 Symposium 2012, Micron, JEDEC, 28 pages.

* cited by examiner

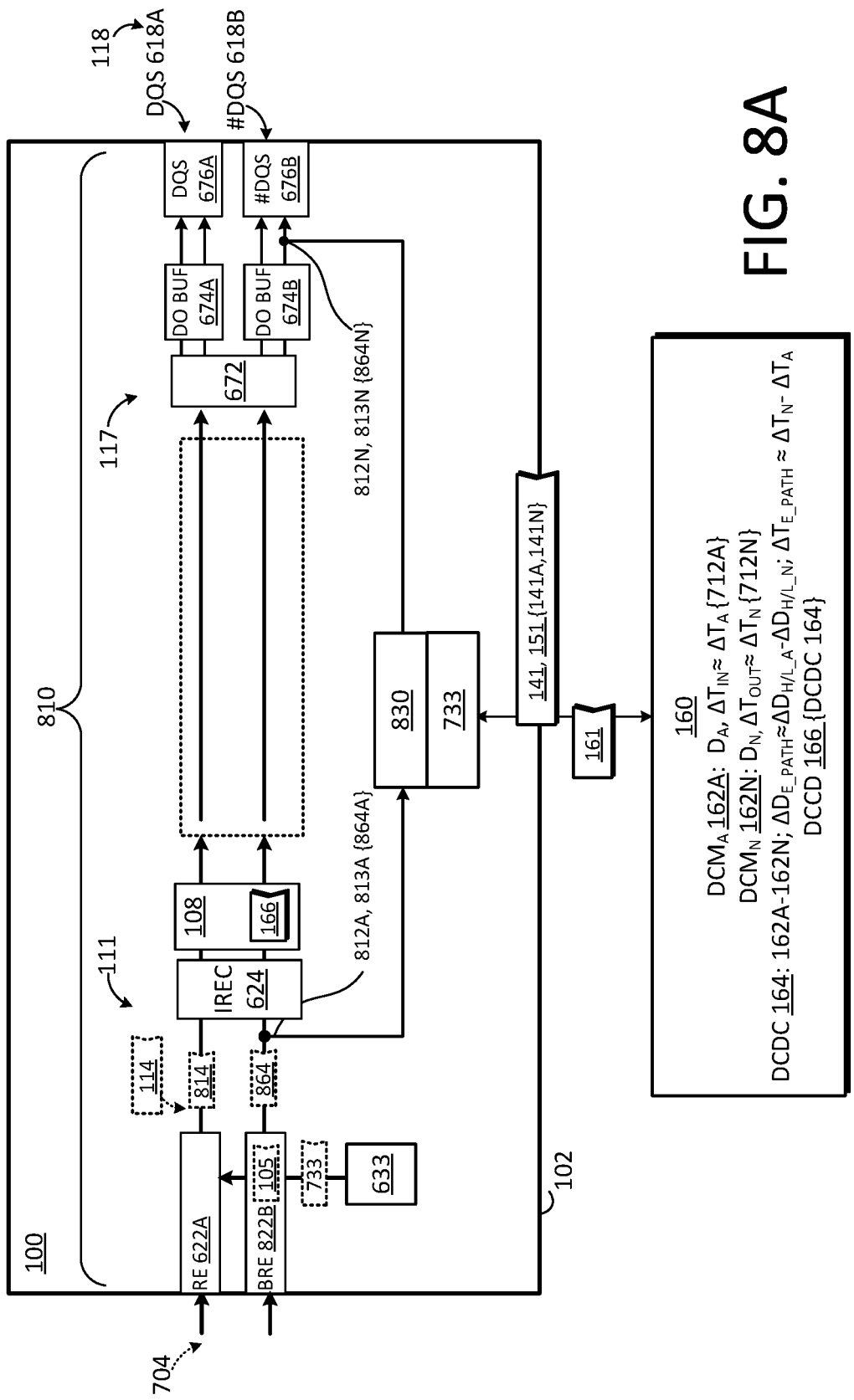

SYSTEMS AND METHODS FOR DUTY CYCLE MEASUREMENT, ANALYSIS, AND COMPENSATION

TECHNICAL FIELD

This disclosure relates to mitigation of duty cycle errors and, more specifically, systems and methods for duty cycle measurement, analysis, and/or compensation.

BACKGROUND

Memory interface circuitry may be susceptible to duty cycle distortion. As used herein, "duty cycle distortion" refers to a change in the duty cycle of a signal as the signal propagates through the circuitry (e.g., as the signal propagates along a path). Duty cycle distortions may cause input/output errors. For example, duty cycle distortion may cause input/output errors, such as high and/or low pulse signal pulse widths that fail to satisfy high pulse width (tQSH) and/or low pulse width (tQSL) timing requirements. Increasing input/output clock speeds and lower input/output (I/O) voltage potentials and/or currents may result in less tolerance, such that even small duty cycle distortions can result in I/O errors.

Conventional duty cycle calibration circuitry may not be capable of scaling down to operate at required clock frequencies, and may not be capable of detecting internal duty cycle distortion created by the circuitry itself. Moreover, conventional duty cycle calibration circuitry can be required to periodically recalibrate, which can adversely impact performance. Internal duty cycle distortion can be caused by a number of different factors, which may not be known at design time (e.g., manufacturing defects, process variations, and the like). Therefore, the internal duty cycle distortion may have to be measured through in situ testing of the manufactured device at frequencies that exceed the capabilities of conventional built-in test circuitry. Measuring internal duty cycle distortion may be further complicated since duty cycle distortion in input signals may be reflected in such measurements. Therefore, what are needed are systems and methods for duty cycle measurement, analysis and/or compensation to accurately quantify and compensating for duty cycle distortions resulting from internal signal propagation, that are not susceptible to input signal distortion, do not adversely impact high-speed timings, and impose minimal size, performance, and/or power consumption overhead.

BRIEF DESCRIPTION OF THE DRAWINGS

FIG. 8A is a schematic block diagram of another embodiment of a data path comprising duty cycle measurement circuitry.

DETAILED DESCRIPTION

Figure 1A:
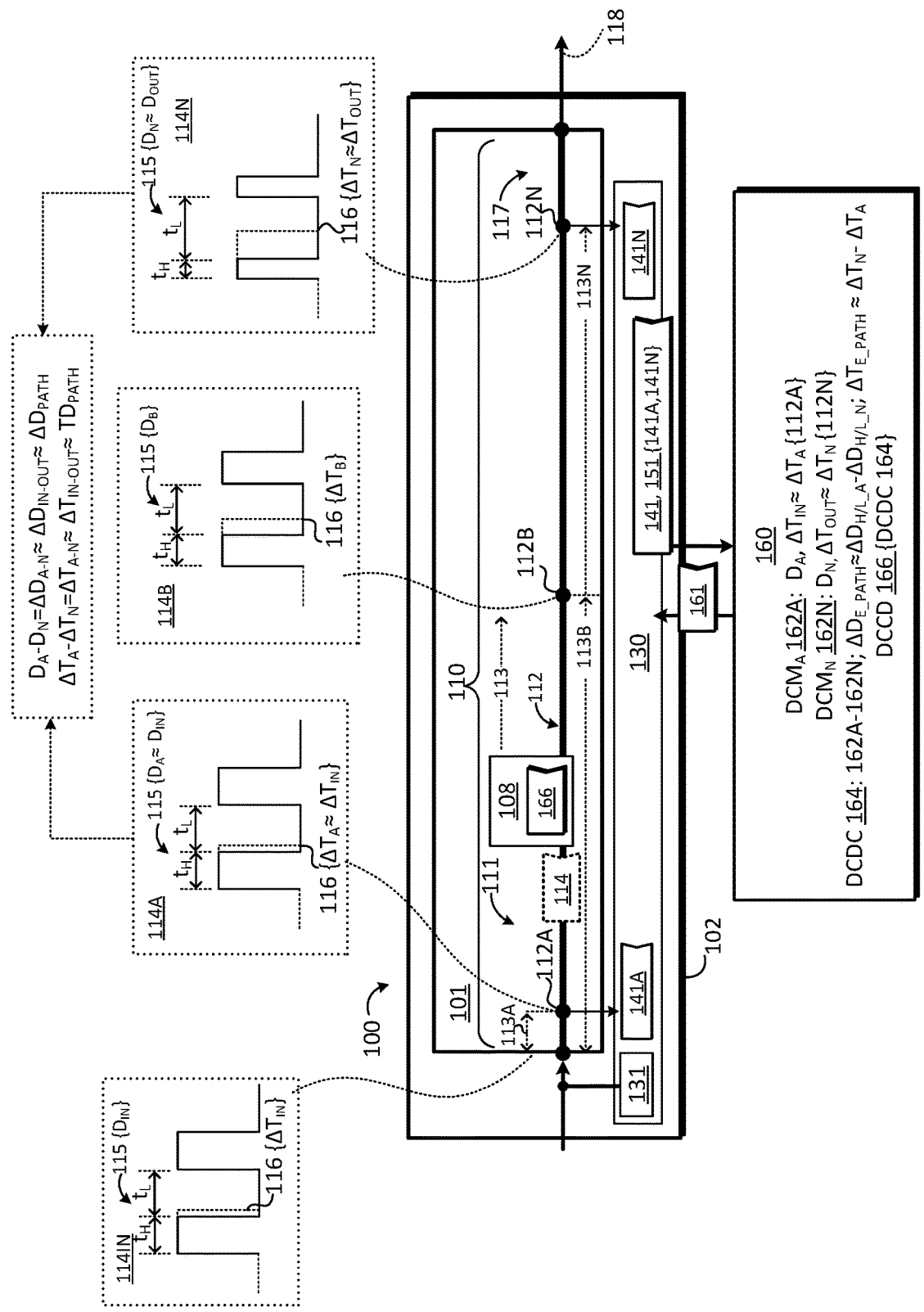
FIG. 1A is a schematic block diagram of one embodiment of a duty cycle measurement circuit.

Disclosed herein are embodiments of systems, methods, circuits, apparatus, and devices for duty cycle measurement, analysis, and/or compensation. Disclosed herein are embodiments of a circuit comprising a data path. The circuit may comprise a first measurement circuit configured to acquire first duty cycle measurements from the data path, and a second measurement circuit configured to acquire second duty cycle measurements from the data path. The first measurement circuit and the second measurement circuit may be communicatively coupled to different positions along the data path such that a difference between the first duty cycle measurements and the second duty cycle measurements corresponds to a duty cycle degradation along the data path. The first measurement circuit may be communicatively coupled to a first position along the data path, the first position configured such that the first duty cycle measurements correspond to an input duty cycle. The second measurement circuit may be communicatively coupled to a second position along the data path, the second position configured such that the second duty cycle measurements correspond to an output duty cycle. The data path may comprise input circuitry, and the first measurement circuit may be communicatively coupled to the input circuitry. The data path may comprise data output circuitry, and the second measurement circuit may be communicatively coupled to the data output circuitry.

The circuit may further include control circuitry configured to selectively couple one of the first measurement circuit and the second measurement circuit to an output pad. A test device may receive the duty cycle measurements through the output pad, including first duty cycle measurements and second duty cycle measurements. The test device may be further configured to determine a measure of the duty cycle degradation along the data path by use of the received duty cycle measurements, and to determine a duty cycle adjustment parameter for the data path based on the measure of the duty cycle degradation. The circuit may further comprise a duty cycle adjust circuitry configured to adjust a duty cycle of an oscillating signal propagating through the data path based on the determined duty cycle adjustment parameter.

The first measurement circuit may comprise a first resistor capacitor (RC) circuitry, and the measurement circuit may comprise second RC circuitry. The first duty cycle measurements may comprise voltage potentials on the first RC circuitry while the first RC circuitry is communicatively coupled to a first position along the data path. The second duty cycle measurements may comprise voltage potentials on the second RC circuitry while the second RC circuitry is communicatively coupled to a second position along the data path. The first RC circuitry and the second RC circuitry may share a capacitor. The circuit may further comprise control circuitry configured to selectively connect the shared capacitor to one of the first position along the data path and the second position along the data path. The control circuitry may comprise a first switch, including a metal-oxide-semiconductor (MOS) transistor having a source terminal connected to the first position along the data path, a drain terminal connected to the shared capacitor through a first resistor, and a gate terminal coupled to a first enable signal. The control circuitry may comprise a second switch, including a metal-oxide-semiconductor (MOS) transistor having a source terminal connected to the second position along the data path, a drain terminal connected to the shared capacitor through a second resistor, and a gate terminal coupled to a first enable signal.

Disclosed herein are embodiments of a semiconductor device, comprising data output circuitry having a timing path, the data output circuitry configured to communicate a timing signal along the timing path from an input region to an output region. The semiconductor device may further comprise duty cycle measurement circuitry configured to measure a duty cycle error associated with the timing path. The duty cycle measurement circuitry may be configured to determine an input duty cycle metric corresponding to a duty cycle of the timing signal in the input region of the timing path, and an output duty cycle metric corresponding to a duty cycle of the timing signal in the output region of the timing path. A difference between the input duty cycle metric and the output duty cycle metric may comprise a measure of the duty cycle error associated with the timing path.

The duty cycle measurement circuitry may be configured to acquire differential duty cycle measurements, which may comprise an input duty cycle metric and an output duty cycle metric, and to provide the differential duty cycle measurements to a diagnostic device. The diagnostic device may be configured to determine a duty cycle adjustment to correct the measure of the duty cycle error associated with the timing path by use of the differential duty cycle measurements. The diagnostic device may be configured to write the determined duty cycle adjustment to a storage location of the semiconductor device. The semiconductor device may further comprise a duty cycle correction circuit configured to implement the determined duty cycle adjustment written to the storage location.

The duty cycle measurement circuitry may comprise an accumulator circuit having an input node and an output node. The input duty cycle metric may correspond to charge accumulated at the output node while the input node is coupled to the input region of the timing path, and the output duty cycle metric may correspond to charge accumulated at the output node while the input node is coupled to the output region of the timing path.

In some embodiments, the duty cycle measurement circuit comprises RC circuitry having an input connected to a capacitive element of the RC circuitry through a resistive element of the RC circuitry and control circuitry configured to selectively connect the input of the RC circuitry to one of the input region of the timing path and the output region of the timing path. The input duty cycle metric may correspond to a voltage potential on the capacitive element while the input of the RC circuitry is connected to the input region of the timing path. The output duty cycle metric may correspond to a voltage potential on the capacitive element of the RC circuitry while the input of the RC circuitry is connected to the output region of the timing path. The capacitive element may comprise a node connected to a generator, and the duty cycle measurement circuit may be configured to selectively disable the generator.

Embodiments of the duty cycle measurement circuitry may comprise a first capacitor, and a second capacitor. The input duty cycle metric may correspond to a voltage potential across the first capacitor while the first capacitor is connected to a first location on the timing path through first input circuitry, the first location within the input region of the timing path. The output duty cycle metric may correspond to a voltage potential on the second capacitor while the second capacitor is coupled to a second location on the timing path, the second location within the output region of the timing path. In some embodiments, the first capacitor and the second capacitor may comprise a common capacitive element. The first input circuitry may be configured to selectively connect the first location on the timing path to the common capacitive element, and the second input circuitry may be configured to selectively connect the second location on the timing path to the common capacitive element. The input duty cycle metric may correspond to a voltage potential on the common capacitive element while the common capacitive element is connected to the first position of the timing path and is disconnected from the second position of the timing path. The output duty cycle metric may correspond to a voltage potential on the common capacitive element while the common capacitive element is connected to the second position of the timing path and is disconnected from the first position of the timing path.

Disclosed herein are embodiments of methods for duty cycle measurement, analysis, and/or compensation. Embodiments of the disclosed methods may comprise acquiring first measurements corresponding to a duty cycle of an input signal being propagated through a data path. Acquiring the first measurements may comprise connecting an input of an RC circuit at a first propagation distance within the data path, the input connected to receive a first time-variant signal corresponding to propagation of the input signal through the first propagation distance within the data path, and acquiring first voltage potential measurements on an output of the RC circuit while the input of the RC circuit is connected at the first propagation distance along the data path.

The method may further include acquiring second measurements corresponding to the duty cycle of the input signal being propagated through the data path. Acquiring the second measurements may comprise connecting the input of the RC circuit at a second propagation distance along the data path, the input connected to receive a second time-variant signal corresponding to propagation of the input signal through the second propagation distance within the data path, the second propagation distance larger than the first propagation distance, and acquiring second voltage potential measurements on the output of the RC circuit while the input of the RC circuit is connected at the second propagation distance along the data path. Embodiments of the method may further include determining a duty cycle correction for the data path based on differentials between the first voltage potential measurements and the second voltage potential measurements.

Disclosed herein are embodiments of a system for duty cycle measurement, analysis, and/or compensation. Embodiments of the disclosed systems may include means for measuring a first voltage potential on a capacitor while an input of the capacitor is connected to a first location along a data path of data output circuitry, the first location comprising a first oscillating signal formed in response to propagating a signal from an input to the data path to the first location along the data path; and means for measuring a second voltage potential on the capacitor while the input of the capacitor is connected to a second location along the data path of the data output circuitry, the second location comprising a second oscillating signal formed in response to propagating the signal from the input to the data path to the second location along the data path, the second location different from the first location. The disclosed system may further include means for determining a duty cycle correction for the data path, the duty cycle correction corresponding to a difference between the first voltage potential and the second voltage potential.

FIG. 1A is a simplified schematic diagram of a circuit 100 comprising interface circuitry 101. The interface circuitry 101 may be embodied on a semiconductor 102, which may comprise a chip, die, package, and/or the like. The interface circuitry 101 may be communicatively coupled to memory circuitry which may be configured to, inter alia, write data to non-volatile memory cells, read data from the non-volatile memory cells, and/or the like (not shown in FIG. 1A to avoid obscuring details of the illustrated embodiments). The interface circuitry 101 may comprise data input/output circuitry, data input/output path circuitry, data output path circuitry, a data output path, a signal path, a timing path, and/or the like. The interface circuitry 101 may have a path 110 comprising an input region 111 and an output region 117.

The input region 111 of the path 110 may comprise circuitry configured to receive, inter alia, external input signals, which may comprise one or more time-variant and/or oscillating signals, including, but not limited to: timing signals, clock signals, read enable signals, differential signals, inverse timing signals, data strobe signals, and/or the like. The input region 111 may further comprise circuitry configured to propagate a signal 114 corresponding to the inputs through the path 110 (through the input region 111 towards the output region 117). The signal 114 may correspond to an external input signal (e.g., a timing signal, a clock signal, a read enable signal, an inverse or differential timing signal, an inverse or differential clock signal, and/or the like), test stimulus (e.g., test signals), and/or the like. The interface circuitry 101 may use the signal 114 to produce an output signal 118 (at the output region 117 of the path 110). As used herein, "propagating" a signal 114 may comprise: a) communicating the signal 114 along path 110 (such that the signal 114 flows from the input region 111 towards the output region 117), b) processing and/or manipulating the signal 114, c) deriving other signal(s) from the signal 114, and/or the like. Accordingly, propagating a signal 114 may include, but is not limited to: amplifying the signal 114, filtering the signal 114, buffering the signal 114, dividing the signal 114, trimming the input signal 114, adjusting a duty cycle of the signal 114, shifting the signal 114, delaying the signal 114, repeating the signal 114, and/or the like. The interconnect circuitry 101 may comprise any suitable means for propagating a signal 114 along path 110, which may include, but are not limited to: traces, semiconductor traces, signal traces, conductors, semiconductor layers, conductive and/or insulating layers, conductive tracks, signal tracks, vias, pads, wires, channels, buses, interconnects, and/or the like. The path 110 may further comprise means for manipulating, processing, and/or deriving signal(s) from the signal 114, which may include, but are not limited to: amplifier circuitry, differential circuitry, differential amplifier circuitry, delay circuitry, repeater circuitry, driver circuitry, buffer circuitry, interconnect circuitry, switch circuitry, routing circuitry, on-die termination (ODT) circuitry, signal generator circuitry, oscillator circuitry, and/or the like.

As disclosed above, the signal 114 may comprise a time-variant and/or oscillating signal having a duty cycle 115. As used herein, the "duty cycle" 115 of a signal 114 refers to the proportion of time the signal 114 is in a particular state. The "state" of a signal 114 may refer to a voltage potential of the signal 114 and/or logical interpretation of the signal 114 (e.g., the proportion of time a signal is interpreted as a logical "1" versus a logical "0"). Alternatively, or in addition, the state of the signal 114 may refer to a threshold voltage potential (e.g., the proportion of time a signal is above a particular voltage potential threshold versus the time the signal is below the threshold). In the FIG. 1A embodiment, the duty cycle of signal 114 may refer to the time the input signal 114 is in a high state ($t_H$) versus a low state ($t_L$) during a particular cycle. As used herein, $t_H$ refers to the time during which a signal is interpreted as being high (e.g., interpreted as a logical "1") during a cycle, and $t_L$ refers to the time during which the signal is interpreted as being deasserted during the cycle (e.g., interpreted as a logical "0"). Therefore, as used herein, $t_H$ may refer to a high pulse width of a signal, and $t_L$ may refer to a low pulse width of the signal, such that $t_H + t_L$ corresponds to the period $t_p$ of the signal ($t_H + t_L = t_p$).

At the input region 111 of the path 110, the signal 114 may comprise and/or correspond to an input signal 114IN having an input duty cycle ($D_{IN}$) and input duty cycle distortion ($\Delta T_{IN}$). The input signal 114IN may correspond to an external input signal received at input region 111 and/or test signal generated within the circuit 110 (as disclosed in further detail herein). The input signal 114IN may be substantially free from duty cycle distortion, such that $t_H \approx t_L$ during respective cycles thereof (and $\Delta T_{IN}$ is near zero). Alternatively, and as illustrated in FIG. 1A, the input signal 114IN may have an initial input duty cycle distortion ($\Delta T_{IN}$).

As disclosed above, the interface circuitry 101 may be configured to propagate the signal 114 along the path 110. The duty cycle of the signal 114 may be distorted as the interface circuitry 101 propagates the signal 114 along the path 110. At locations near the input region 111, the signal 114 may be substantially unchanged. At locations farther along the path 110, the signal 114 may become distorted, resulting in degradation to the duty cycle 115 and/or increased duty cycle distortion 116. FIG. 1A depicts exemplary signals 114 at various propagation locations and/or positions 112 within the interface circuitry 101 (along the path 110). The propagation locations 112 may correspond to respective propagation distances and/or offsets 113 within the path 110. As used herein, a "propagation location," "path location," "location," "propagation position," "path position," and/or "position" 112 refers to a particular location along and/or within the path 110 of the interface circuitry 101 (e.g., circuitry comprising and/or between the input region 111 and output region 117 of the path 110). A path location 112 may refer to a particular position along and/or within signal communication means of the path 110, such as a wire, signal trace, interconnect circuitry, switch circuitry, routing circuitry, driver circuitry, sense circuitry, and/or the like. Alternatively, or in addition, a path location 112 may refer to propagation of the signal 114 through signal processing and/or manipulation means of the path 110, which may include, but is not limited to: buffer circuitry, ODT circuitry, signal processing circuitry (e.g., differential amplifier circuitry), duty cycle adjust circuitry 108, data output circuitry, and/or the like. As used herein, a "propagation distance," "path distance," "distance," "propagation offset," "path offset," and/or "offset" 113 refers to propagation of a signal 114 by a designated distance along, through, and/or within the path 110. A propagation distance 113 may refer to communication of a signal 114 between two different positions or locations 112 along and/or within the path 110, as disclosed herein (e.g., communication of the signal 114 through signal communication and/or processing means of the path 110). Accordingly, a propagation distance 113 may refer to communication of a signal 114 as well as processing and/or manipulation of the signal 114 (and/or deriving other signal(s) 114 therefrom) within the path 110.

FIG. 1A depicts signal 114A at location 112A along the path 110. The location 112A may be proximate to the input region 111 of the interface circuitry 101. In some embodiments, the signal 114A may comprise the signal 114IN (e.g., input signal, such as an external input signal received via ODT circuitry, a test input signal, and/or the like). Location 112A may be configured such that the duty cycle of the signal 114A at location 112A is substantially the same as the duty cycle of the input signal 104 (may not have deteriorated during propagation along the path 110 of the interface circuitry 101). The location 112A may be within a propagation distance threshold, which may correspond to a propagation distance 113 that does not result in significant changes to the duty cycle of the signal 114. Therefore, as illustrated in FIG. 1A, the duty cycle 115 ($D_A$) of the signal 114A at location 112A may be substantially the same as the duty cycle ($D_{IN}$) of signal 114IN (e.g., may comprise a nominal duty cycle distortion 116 $\Delta T_A$ substantially equivalent to $\Delta T_{IN}$).

FIG. 1A further illustrates exemplary signal 114B, which represents the signal 114 after propagation to position 112B along the path 110 of the interface circuitry 101. The duty cycle distortion 116 ($\Delta T_B$) of the signal 114B has increased during propagation along propagation distance 113B (e.g., $\Delta T_B > \Delta T_A$ and $\Delta T_{IN}$). The additional duty cycle distortion ($\Delta T_B - \Delta T_A$) may be incurred during propagation of the signal 114 from location 112A to location 112B along the path 110 of the interconnect circuitry. Exemplary signal 114N represents the signal 114 after propagation to position 112N (propagation distance 113N). The position 112N may be at, within, and/or near the output region 117 of the path 110 and, as such, the duty cycle 115 ($D_N$) and/or duty cycle distortion 116 ($\Delta T_N$) of signal 114N may be substantially the same as the duty cycle 115 and/or duty cycle distortion 116 of the signal 114 used to produce the output data signal(s) 118. Therefore, the duty cycle 115 ($D_N$) and duty cycle distortion 116 ($\Delta T_N$) of the signal 114N at location 112N may be referred to as the output duty cycle ($D_{OUT}$) and output duty cycle distortion ($\Delta T_{OUT}$) of the path 110 and/or interface circuitry 101. The output duty cycle distortion 116 $\Delta T_{OUT}$ may correspond to propagation of the signal 114 to propagation offset 113N (e.g., from the input region 111 and/or position 112A to the output region 117 and/or position 112N along the data path 110).

Figure 2A:
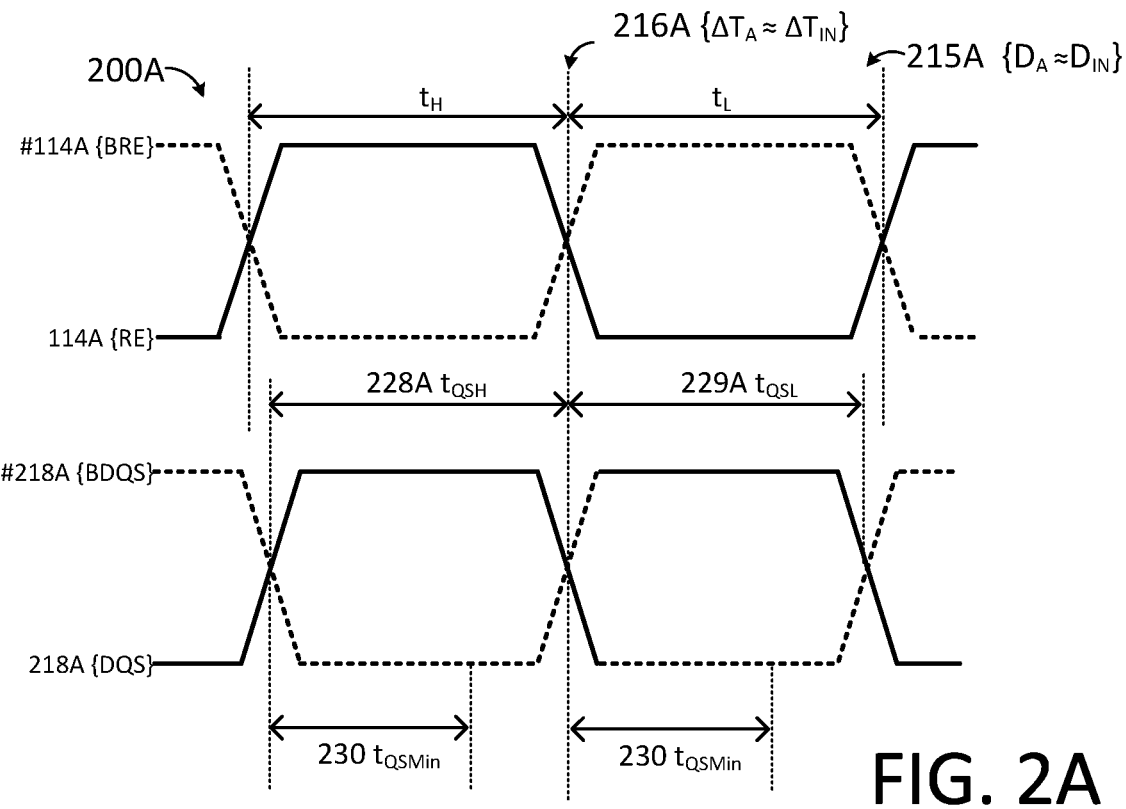
FIG. 2A depicts timing diagrams of exemplary timing and data output signals.

As disclosed above, the signal 114N may be used to generate data output signals 118 by the interface circuitry 101. The interface circuitry 101 may use the signal 114N as an output timing signal (e.g., an output clock), to produce a data strobe output (DQS and/or inverse signal, such as #DQS or BDQS), and/or the like. The duty cycle distortion 116 ($D_N$ and/or $D_{OUT}$) at location 114N may, however, cause the data output signal 118 to fail to comply with timing constraints (e.g., tQSH and/or tQSL). FIG. 2A is a plot 200A illustrating an exemplary timing signal 114A (and inverse timing signal #114A) used to produce data strobe output signals DQS 218A and BDQS #218A. The timing signal 114A may correspond to the initial input signal 114IN (before additional duty cycle distortion is incurred during propagation along path 110). As shown in plot 200A, the duty cycle 215A of the signal 114A ($D_A$) may correspond to $D_{IN}$, and the duty cycle distortion 216A ($\Delta T_A$) may correspond to $\Delta T_{IN}$ (and be substantially 0). As such, $t_H$ and $t_L$ of the signal 114A may be substantially equal. If the interface circuitry 101 were to use signal 114A (and #114A) to produce data output signals 118 (DQS and BDQS), the minimal duty cycle distortion 116 ($\Delta T_A \approx \Delta T_{IN} \approx 0$) would enable the resulting DQS 218A and BDQS #218A to comply with output timing constraints, such as tQSMin 230, which may define a minimum pulse width for $t_H$ and $t_L$, respectively. As illustrated in plot 200A, the high and low pulse widths tQSH 228A and tQSL 229A of DQS 218A and BDQS #218A corresponding to signal 114A are substantially equivalent, and comply with the constraint 230 tQSMin.

Figure 2B:
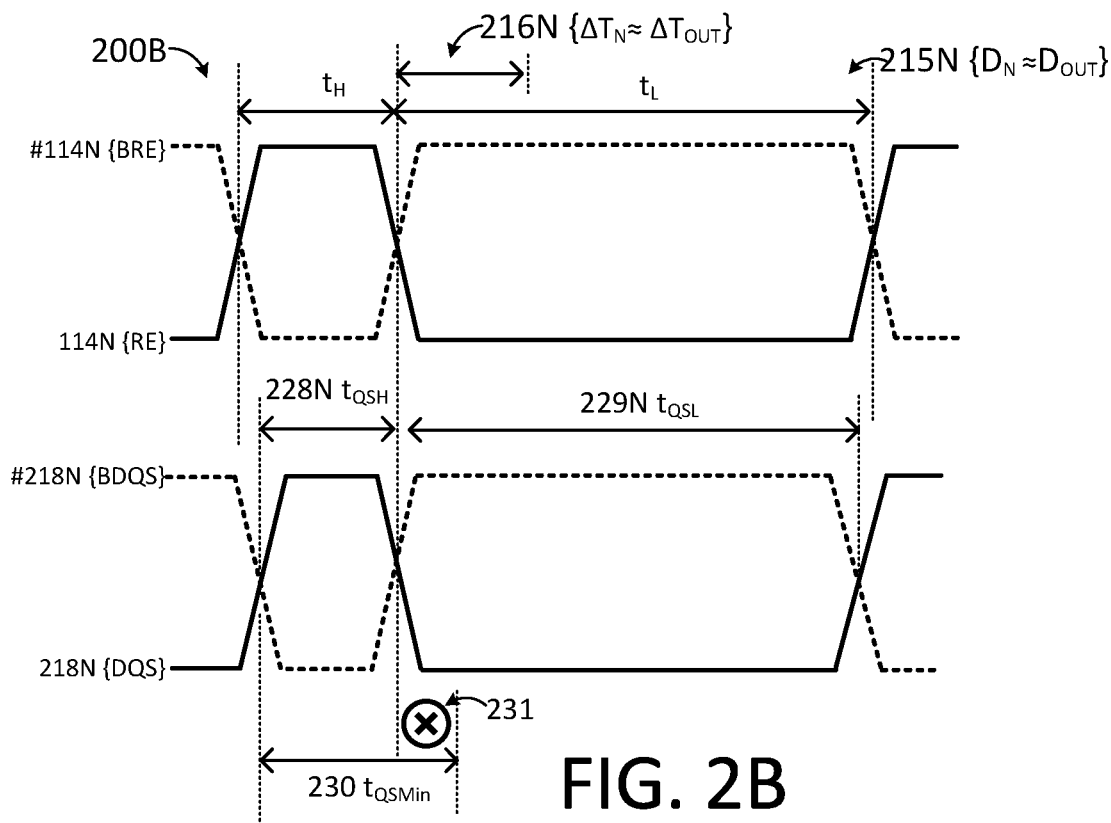
FIG. 2B depicts timing diagrams of exemplary timing and data output signals.

Plot 200B of FIG. 2B illustrates signal 114N, which may correspond to propagation of the signal 114 to location 112N (along propagation distance 113N). The duty cycle 215N ($D_N \approx D_{OUT}$) of the signal 114N may be distorted during propagation from location 112A to location 112N (propagation distance 113N) along the path 110 of the interface circuitry 101. The duty cycle distortion 216N ($\Delta T_N \approx \Delta T_{OUT}$) may result in $t_H$ being significantly shorter than $t_L$. The signal 114N may be used to generate data output signals DQS 218N and BDQS #218N using circuitry embodied within the output region 117 of path 110. The duty cycle distortion 116N ($\Delta T_N$) of signal 114N (and #114N) may cause one or more of tQSH and tQSL of the resulting DQS signals 218A and/or BDQS signals #218N to violate the constraint tQSMin 230. As illustrated in FIG. 2B, at 231, tQSH 228N of DQS 218N and tQSL of #DQS 218N fail to satisfy the tQSMin 230 constraint parameter at 231, which may result in data input/output errors.

Referring back to FIG. 1A, the interface circuitry 101 may comprise duty cycle adjust circuitry 108, which may be configured to, inter alia, adjust and/or trim the duty cycle of signals 114 during propagation of such signals 114 within the interface circuitry 101 (e.g., along path 110). However, and as disclosed above, the amount of duty cycle adjustment and/or trim required to compensate for duty cycle deterioration along the path 110 may vary based on factors which may not be known at design time (e.g., process variations, fabrication variations, defects, and/or the like). Although duty cycle calibration circuitry may be capable of adjusting to duty cycle distortion in external input signals, such circuitry may not be capable of detecting and/or compensating for duty cycle distortion incurred during propagation of the signal 114 (e.g., along the path 110 of the interface circuitry 101 itself). Moreover, duty cycle calibration circuitry may be cost prohibitive, may have operating frequency limitations (e.g., may be incapable of being scaled down to operate at sufficiently high clock rates), may impose significant layout and power overhead, and may adversely impact performance (due to the need for periodic recalibration).

The circuit 100 may comprise a duty cycle measurement circuit 130, which may be configured to obtain duty cycle measurements within the path 110, which may be used to quantify the amount of duty cycle degradation imposed on the signal 114 during propagation through the interconnect circuitry 101 (along path 110). The duty cycle measurements may be leveraged to determine a duty cycle adjustment and/or trim factor, which may be used to compensate for the actual, measured duty cycle degradation occurring in the fabricated circuit 100 (through in situ duty cycle testing and analysis of the circuit 100). The circuit 100 may further comprise duty cycle adjust circuitry 108, which may be configured to implement one or more duty cycle adjustments based on, inter alia, the duty cycle adjustment and/or trim factor determined for the circuit 100. The duty cycle adjust parameter may be stored and/or recorded within the circuit 100. In some embodiments the duty cycle adjust and/or trim factor may be recorded in read only memory (ROM) of the interconnect circuitry 101 (e.g., recorded in a ROM fuse of the duty cycle adjust circuitry 108).

The duty cycle measurement circuit 130 may be configured to a) obtain duty cycle measurements 141 corresponding to the duty cycle of the signal 114 at different locations 112 along the path 110, and b) provide the duty cycle measurements 141 to a diagnostic device 160. The diagnostic device 160 may use the duty cycle measurements 141 to, inter alia, determine the duty cycle deterioration occurring within the circuit 100 and/or configure the duty cycle adjust circuitry 108 of the circuit to compensate. The diagnostic device 160 may comprise a computing device having a processor, memory, non-transitory storage, human-machine interface components (e.g., display, input devices), communication interface(s), and/or the like. The diagnostic device 160 may be communicatively coupled to the circuit 100 through any suitable means including, but not limited to, a data bus, a memory interface, a dedicated test interface, one or more probe(s), one or more input/output pads, one or more input/output pins, and/or the like.

In some embodiments, the duty cycle measurement circuit 130 is configured to obtain duty cycle measurements 141 from two (or more) different locations 112 and/or propagation distances 113 along the path 110. In the FIG. 1A embodiment, the duty cycle circuit 130 is configured to obtain duty cycle measurements 141A and 141N. The duty cycle measurements 141A may correspond to the duty cycle of the signal 114A at location 112A (after propagation distance 113A along the path 110). The duty cycle measurements 141N may correspond to the duty cycle of the signal 114N at location 112N (after propagation distance 113N along the path 110). As disclosed above, the location 112A may be at and/or in proximity to the input region 111, and the location 112N may be at and/or in proximity to the output region 117 of the interconnect circuitry 101. As such, the duty cycle ($D_A$) and/or duty cycle deterioration ($\Delta T_A$) of the input signal 114A (if any) may be substantially equivalent to the input duty cycle ($D_{IN}$) and/or input duty cycle degradation (ATM, such that $D_A \approx D_{IN}$ and $\Delta T_A \approx \Delta T_{IN}$. The duty cycle ($D_N$) and/or duty cycle deterioration ($\Delta T_N$) of the signal 114N at location 112N may comprise and/or correspond to the output duty cycle ($D_{OUT}$) and/or output duty cycle degradation ($\Delta T_{OUT}$), such that $D_N \approx D_{OUT}$ and $\Delta T_N \approx \Delta T_{OUT}$.

As illustrated in FIG. 1A, the differential duty cycle measurements 151 (measurements 141A and 141N) may be compared to determine a measure of one or more of a) the duty cycle error associated with the path 110 ($\Delta D_{E\_PATH}$), and/or b) the duty cycle distortion error associated with the path 110 ($\Delta T_{E\_PATH}$). The duty cycle error ($\Delta D_{E\_PATH}$) may comprise a measure of the change to the duty cycle of the signal 114 as the signal 114 is propagated through the input region 111 to the output region. The duty cycle distortion error ($\Delta T_{E\_PATH}$) may comprise a measure of change to the duty cycle distortion in the signal 114 as the signal 114 is propagated through the input region 111 to the output region 117. The measures of $\Delta D_{E\_PATH}$ and $\Delta T_{E\_PATH}$ may, therefore, correspond to a differential and/or comparison between a) duty cycle measurements corresponding to the input region 111 (where $D_{IN} \approx D_A$ and $\Delta T_{IN} \approx \Delta T_A$) and b) duty cycle measurements corresponding to the output region 117 (where $D_{OUT} \approx D_N$ and $\Delta T_{OUT} \approx \Delta T_N$). Accordingly, $\Delta D_{E\_PATH}$ and $\Delta T_{E\_PATH}$ may be defined as:

$$\Delta D_{E\_PATH} = D_{OUT} - D_{IN} \approx D_N - D_A \approx f_D(141N) - f_D(141A)$$

$$\Delta T_{E\_PATH} = \Delta T_{OUT} - \Delta T_{IN} \approx \Delta T_{OUT} - \Delta T_{IN} \approx f_{\Delta T}(141N) - f_{\Delta T}(141A) \quad \text{Eq. 1}$$

In Eq. 1, $f_D$ and $f_{\Delta T}$ are conversion functions between duty cycle measurements 141 duty cycle (D) and duty cycle distortion ($\Delta T$), respectively. As disclosed in further detail herein, in some embodiments, the duty cycle measurements 141 may comprise measurements of a voltage potential ($V_M$) corresponding to voltage potential, including: voltage potential accumulated while the signal 114 is in a high state (while the signal 114 is at high voltage potential $V_H$), and discharged while the signal 114 is in a low state (while the signal 114 is at low voltage potential $V_H$). In such embodiments, $f_D$ and $f_{\Delta T}$ may comprise functions to convert the measured voltage potential ($V_M$) to duty cycle and duty cycle distortion measurements, as follows:

$$D = \frac{V_{REF} - V_M}{V_{REF}} \quad \text{Eq. 2}$$

$$\Delta T = \left| \frac{t_p}{2} - (D * t_p) \right| \text{ or } \left| \frac{t_p}{2} - \left( \left( \frac{V_{REF} - V_M}{V_{REF}} \right) * t_p \right) \right|$$

In Eq. 2, $V_{REF}$ is a difference between $V_H$ and $V_L$ and $t_p$ is the period of the signal 114. Although particular techniques for acquiring duty cycle measurements are disclosed herein, the disclosure is not limited in this regard and could be adapted to acquire duty cycle measurements using any suitable measurement technique and/or methodology.

As disclosed above, the duty cycle error within path 110 may be characterized by differentials and/or comparisons between duty cycle measurements 141A and 141N corresponding to different respective path locations 112 and/or propagation distances 113. Accordingly, the duty cycle measurements 141A and 141N may be referred to as differential duty cycle measurements 151. As used herein, "differential duty cycle measurements" and/or "differential duty cycle metrics" refer to duty cycle measurements 141 and/or metrics corresponding to different path locations 112 and/or propagation distances 113. Differential duty cycle measurements 151 (e.g., measurements 141A and 141N) may be used to determine measures of internal duty cycle error ($\Delta D_{E\_PATH}$) and/or internal duty cycle distortion error ($\Delta T_{E\_PATH}$) that are characterized as being substantially independent of input duty cycle distortion, variance, and/or instability (e.g., duty cycle distortion, variance, and/or instability in the signal(s) 114 used to acquire the duty cycle measurements 141). As disclosed above, the signal 114 may comprise an initial and/or input duty cycle distortion (referred to as X in this example). The differential duty cycle measurements 151 will both incorporate this initial duty cycle error X. The duty cycle measurements 141A corresponding to location 112A will comprise and/or correspond to a duty cycle distortion ($\Delta T_A$) of about X (e.g., due location 112A being within and/or proximate to the input region 111 of the path 110). Propagation of the signal 114 to the output region 117 (e.g., to path location 112N along propagation distance 110) creates additional duty cycle distortion in the signal 114. As disclosed above, this additional duty cycle distortion is the duty cycle distortion error of the path 110 ($\Delta T_{E\_PATH}$). Accordingly, the duty cycle measurements 114N acquired at location 112N will comprise and/or correspond to duty cycle distortion ($\Delta T_N$), which will comprise a sum of the input duty cycle distortion X and the path duty cycle distortion error ($\Delta T_{E\_PATH}$), such that $\Delta T_N \approx \Delta T_{OUT} = X + \Delta T_{E\_PATH}$. If only one set of duty cycle measurements were used to characterize $\Delta T_{E\_PATH}$, the resulting characterization would be inaccurate (e.g., would erroneously attribute the initial duty cycle distortion X to the path 110, such that $\Delta T_{E\_PATH} = \Delta T_{E\_PATH} + X$). Use of such a characteristic during operation may result in data input/output errors when such characteristic is applied to signals 114 that are not distorted (e.g., do not have the initial distortion X). The use of differential duty cycle measurements 151 may avoid such inaccuracies. As disclosed above, the measure of $\Delta T_{E\_PATH}$ for the path 110 may be determined using differential duty cycle measurements 151 (e.g., a different and/or comparison between measurements 141A and 141N), such that $\Delta T_{E\_PATH} \approx \Delta T_{OUT} - \Delta T_{IN}$, where $\Delta T_{IN} \approx \Delta T_A$ and $\Delta T_{OUT} \approx \Delta T_N$. The differential duty cycle measurements 151 (measurements 141A and 141N) both incorporate the initial duty cycle error X, such that $\Delta T_{IN} \approx \Delta T_A = X$, and $\Delta T_{OUT} \approx \Delta T_N = \Delta T_{E\_PATH} + X$. Therefore, the initial duty cycle X is removed from the characterization of $\Delta T_{E\_PATH}$) for the path 110; $\Delta T_{E\_PATH} \approx (\Delta T_N + X) - X$, such that $\Delta T_{E\_PATH} \approx \Delta T_N$.

The duty cycle measurement circuit 160 may communicate the measurements 141A and 141N to the diagnostic device 160, which may use the duty cycle measurements 141A and 141N to configure the interconnect circuitry 101 to compensate for the duty cycle deterioration measured along the path 110. In some embodiments, the diagnostic device 160 determines a duty cycle error characteristic (DCDC) 164 of the interconnect circuitry 101. The DCDC 164 may quantify an amount of duty cycle deterioration in the signal 114 as the interface circuitry 101 propagates the signal 114 along the path 110 (e.g., from the input region 111 towards the output region 117). The DCDC 164 may comprise a difference and/or comparison between duty cycle measurements 141A obtained at location 112A (where $D_A \approx D_{IN}$ and $\Delta T_A \approx \Delta T_{IN}$) and duty cycle measurements 141N obtained at location 112N (where $D_N \approx D_{OUT}$ and $\Delta T_N \approx \Delta T_{OUT}$). Alternatively, or in addition, the DCDC 164 may quantify a change to the duty cycle of the signal 114 during propagation along the path 110 (e.g., $\Delta D_{E\_PATH}$) and/or change to duty cycle deterioration during propagation along the path 110 ($\Delta T_{E\_PATH}$), as disclosed above.

In some embodiments, the diagnostic device 160 is configured to determine duty cycle metrics $DCM_A$ 162A and $DCM_N$ 162N corresponding to the duty cycle measurements 141A and 141N, respectively. The $DCM_A$ 162A may comprise and/or correspond to one of more of: the duty cycle measurements 141A acquired at location 112A, measurements of the duty cycle ($D_A$) of the signal 114A at location 112A, a high duty cycle pulse of the signal 114A at location 112A ($D_{A\_H}$, or $t_{A\_H}$), a low duty cycle pulse of the signal 114A at location 112A ($D_{A\_L}$ or $t_{A\_L}$), a duty cycle deterioration measured at location 112A ($\Delta T_A$), and/or the like. The $DCM_N$ 162N may comprise and/or correspond to one or more of: the duty cycle measurements 141N acquired at location 112N, a duty cycle ($D_N$) of the signal 114N at location 112N, a high duty cycle pulse at location 112N ($D_{N\_H}$, or $t_{N\_H}$), a low duty cycle pulse at location 112A ($D_{N\_L}$ or $t_{N\_L}$), a duty cycle deterioration of the signal 114N at location 112N ($\Delta T_N$), and/or the like.

The DCDC 164 determined for the interface circuitry 101 may be based on a difference and/or comparison between $DCM_A$ 162A and $DCM_N$ 162N. The DCDC 164 may comprise a difference between the duty cycle measurements 141A and 141N, a duty cycle change along the path 110 of the interconnect circuitry 101 (e.g., $\Delta D_{E\_PATH}$, where $\Delta D_{E\_PATH} \Delta D_{A-N} = D_A - D_N$), a high pulse cycle pulse error (e.g., $\Delta D_{H\_PATH}$, where $\Delta D_{H\_PATH} \approx \Delta D_{H\_A-N} = D_{H\_A} - D_{H\_N}$), a low duty cycle pulse error (e.g., $\Delta D_{L\_PATH}$, where $\Delta D_{L\_PATH} \approx \Delta D_{L\_A-N} = D_{L\_A} - D_{L\_N}$), or a duty cycle deterioration along the path 110 of the interconnect circuitry 101 (e.g., $\Delta T_{E\_PATH}$, where $\Delta T_{E\_PATH} \approx \Delta T_{A-N} = \Delta T_N - \Delta T_A$).

The diagnostic device 160 may be further configured to determine duty cycle correction data 166 for the path 110. The duty cycle correction data 166 may be adapted to configure the duty cycle adjust circuitry 108 to compensate for determined duty cycle error ($\Delta D_{E\_PATH}$) and/or duty cycle distortion error ($\Delta T_{E\_PATH}$) of the path 110 (as characterized by the DCDC 164 determined for the path 110). The duty cycle correction data 166 may comprise configuration data adapted to configure the duty cycle adjust circuitry 108 to implement duty cycle corrections during operation of the circuit. The duty cycle correction data 166 may be adapted to configure the duty cycle adjust circuitry 108 process and/or manipulate signals 114 during propagation within the path 110 (e.g., adjust and/or trim the duty cycle of the signals 114 to compensate for the $\Delta D_{E\_PATH}$ and/or $\Delta T_{E\_PATH}$ to occur as the signals 114 are propagated along the path 110). The duty cycle correction data 166 may include, but is not limited to: a duty cycle adjustment setting, a duty cycle adjustment parameter, duty cycle adjustment rules, a lookup table, firmware, configuration data, code, and/or other information adapted to configure duty cycle adjust circuitry 108 to implement duty cycle corrections within the path 110.

The duty cycle correction data 166 may comprise one or more duty cycle codes, which may correspond to discrete duty cycle adjustment and/or trim settings capable of being implemented by the duty cycle adjust circuitry 108. In some embodiments, the duty cycle adjust circuitry 108 may be configured to implement duty cycle trim operations at a particular granularity (e.g., in 10 ps increments, or the like). The duty cycle correction data 166 may indicate a number of such adjustments to apply to signals 114 during propagation through the path 110 (e.g., apply N adjustments, such that the duty cycle is adjusted by N*10 ps). The duty cycle correction data 166 may define a range of duty cycle correction operations, each operation corresponding to respective operating conditions (e.g., respective operating temperatures, wear levels, and/or the like). The duty cycle correction data 166 may be adapted to configure the duty cycle adjust circuitry 108 to compensate for the measured DCDC 164 of the circuit 100 during each of the specified operating conditions.

The diagnostic device 160 may be configured to program, store, and/or record the duty cycle correction data 166 within one or more of the circuit, semiconductor 102, duty cycle adjust circuitry 108, duty cycle measurement circuitry 130, memory (not shown), and/or the like. In some embodiments, the diagnostic device 160 is configured to record the duty cycle correction data 166 in a register, ROM fuse and/or other storage location accessible to the duty cycle adjust circuitry 108.

As disclosed above, the differential duty cycle measurements 151 (including measurements 141N and/or 141A), the duty cycle metrics $DCM_A$ 162A, $DCM_N$ 162N, DCDC 164, and duty cycle correction data 166 may correspond to in situ testing of the interface circuitry 101 as fabricated on the semiconductor 102 and, as such, may account for process variations (and/or other factors) causing duty cycle distortion within the interface circuitry 101. Accordingly, the duty cycle measurement circuit 130 may provide for accurate duty cycle analysis and compensation, without the need for complex, high-overhead duty cycle calibration circuitry, which can interfere with high-speed signal timing. Using a differential and/or comparison between duty cycle measurements 141 obtained at different locations and/or positions 112 along the path 110 of the interface circuitry 101 to determine DCDC 164 and/or duty cycle correction data 166, as opposed to deriving these quantities from duty cycle measurements 114 acquired at a single location 112 along the path 110, may ensure that DCDC 164 and/or duty cycle correction data 166 are accurate, regardless of noise and/or duty cycle deterioration ($\Delta T_{IN}$), variance, and/or instability in the signal 114.

In some embodiments, the duty cycle measurement circuitry 130 acquires the duty cycle measurements 141A and 141N by, inter alia, providing test inputs to the interface circuitry 101. The test inputs may comprise a test input, data signal, and/or the like. The test input signal may be produced by a signal generator 131. The signal generator 131 may comprise an oscillator, ODT circuitry, an external oscillator, and/or the like. The test inputs may further include test output data, which may be adapted to facilitate accurate duty cycle measurements (e.g., a data pattern configured to minimize jitter, such as an "FF" data pattern). The duty cycle circuitry 130 may be further configured to acquire duty cycle measurements 141A and 141N while applying the test inputs to the interface circuitry 101 and to communicate the acquired duty cycle measurements 141 (e.g., 141A and 141N) to the diagnostic device 160. The duty cycle circuitry 130 may communicate the duty cycle measurements 141A and 141N using any suitable communication mechanism including, but not limited to, an input/output pad, input/output pins, a communication bus, a register (or other storage location), a bus register, and/or the like.

In some embodiments, the diagnostic device 160 may be configured to perform duty cycle analysis operations. The duty cycle analysis operations may be performed during initial testing and/or validation of the fabricated duty cycle circuitry 101 (e.g., during die sort testing). The diagnostic device 160 may comprise a die sort (DS) test device. The diagnostic device 160 may be communicatively coupled to the circuit 100 through one or more probes, input/output pads, input/output pins, a dedicated test interface, and/or the like (not depicted in FIG. 1A to avoid obscuring the details of the illustrated embodiments). The diagnostic device 160 may implement a duty cycle analysis operation by, inter alia, a) providing test input signals to the circuit 100 and/or configuring the circuit 100 to produce the test input signals, b) configuring the duty cycle circuit 130 to obtain duty cycle measurements 141 (including duty cycle measurements 141A corresponding to location 112A, and duty cycle measurements 141N corresponding to location 112N), and c) comparing the duty cycle measurements 141A and 141N to determine a DCDC 164 for the path 110 of the interface circuitry 101. If the DCDC 164 is above a threshold, the duty cycle analysis operation may further comprise configuring the duty cycle adjust circuitry 108 to compensate for the determined DCDC 164. The diagnostic device 160 may provide test input signals by configuring the signal generator 131 to generate a test input signal for propagation along the path 110 and configuring the duty cycle measurement circuitry 130 to acquire duty cycle measurements 141A and 141N while the test input signal is being generated. The threshold may be based on, inter alia, timing requirements of the interface circuitry 101, adjustment and/or trim capabilities of the duty cycle adjust circuitry 108 (e.g., an adjustment and/or trim granularity), and/or the like.

The duty cycle measurement circuit 130 may be configured to acquire the duty cycle measurements 141 by, inter alia, selectively coupling measurement circuitry to the path 110 of the interconnect circuitry 101 (e.g., connecting duty cycle measurement circuitry to locations 112A and/or 112N along the path 110). When connected to location 112A, the duty cycle measurement circuit 130 may acquire duty cycle measurements 141A corresponding to the duty cycle ($D_A$) of the signal 114A at location 112A, and when connected to location 112N, the duty cycle measurement circuit 130 may acquire duty cycle measurements 141N corresponding to the duty cycle ($D_N$) of the signal 114N at location 112N. In some embodiments, the duty cycle measurement circuit 130 is configured to obtain duty cycle measurements 141A and 141N concurrently. In such embodiments, the duty cycle measurement circuit 130 may comprise duty cycle measurement circuitry configured to acquire duty cycle measurements 141A and 141N at location 112A and 112N in parallel (e.g., may comprise separate independent connections to each location 112A and 112N within the path 110). Alternatively, the duty cycle measurement circuit 130 may be configured to obtain the duty cycle measurements 141A and 141N separately (e.g., obtain duty cycle measurements 141A while connected to the path 110 at location 112A, and disconnected from location 112N, and obtain duty cycle measurements 141N while connected to the path 110 at location 112N, and disconnected from location 112A). The duty cycle measurement circuit 130 may be configured to obtain a plurality of duty cycle measurements 141 at each location 112A and 112N (e.g., a plurality of duty cycle measurements 141A and 141N, respectively).

In some embodiments, the duty cycle measurement circuit 130 may be configured to perform one or more duty cycle measurement operations, each of which may comprise a) applying a specified input signal 104 to the input region 111 of the interconnect circuitry 101, b) acquiring a specified number of duty cycle measurements 141 from each of one or more designated positions 112 along the path 110 of the interconnect circuitry 101 while the specified input signal 104 is applied (e.g., position 112A and 112N), c) determining one or more characteristics of the duty cycle measurements 141 (e.g., an average, deviation, variance, and/or the like), and so on. The duty cycle measurement operations may be encoded into one or more of logic circuitry, state machine circuitry, firmware, configuration data, and/or the like. Alternatively, or in addition, the duty cycle measurement operations and/or operation of the duty cycle circuitry 130 may be managed by separate testing and/or diagnostic circuitry (not shown in FIG. 1A to avoid obscuring the details of the illustrated embodiments), and/or the diagnostic device 160.

Figure 1B:
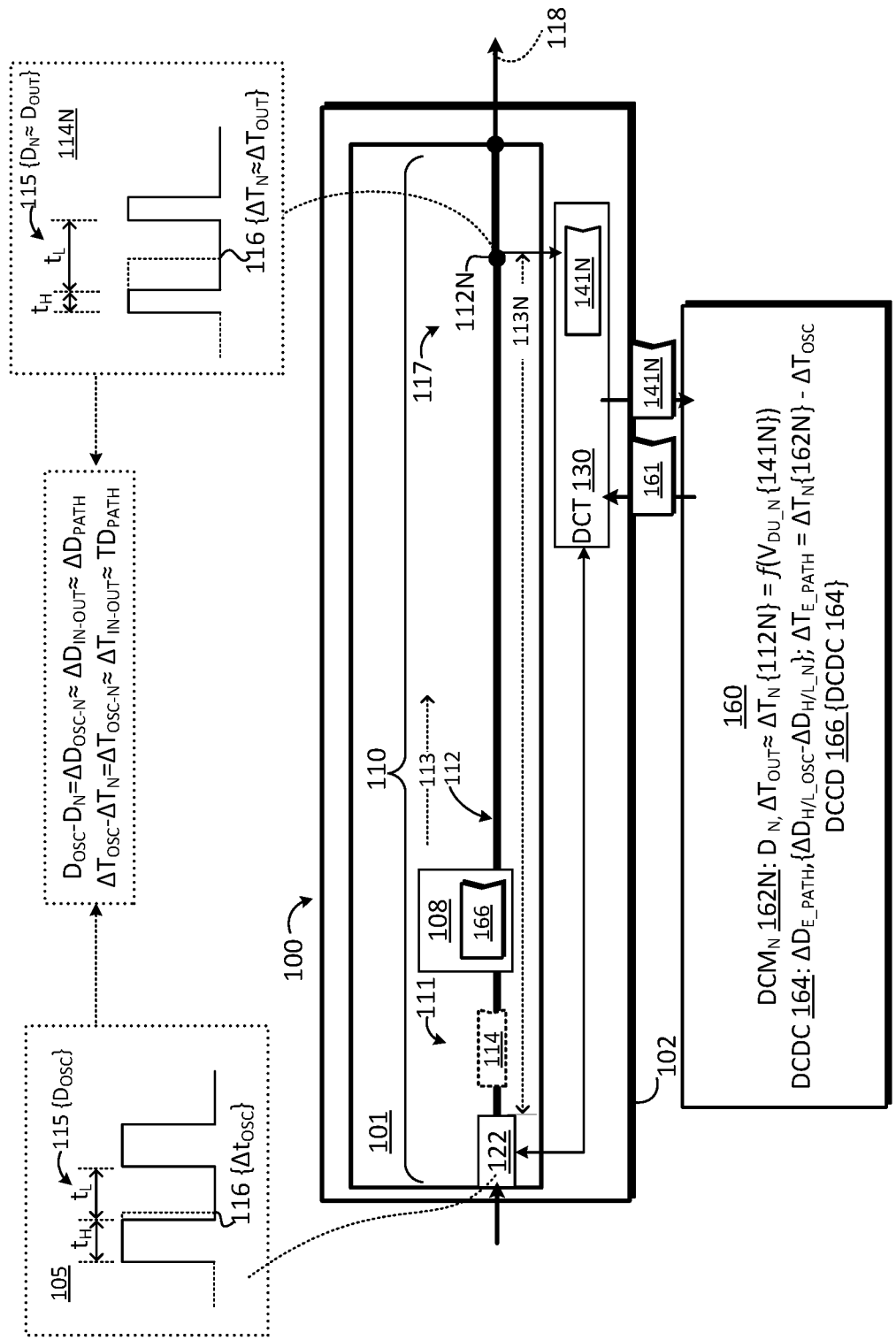
FIG. 1B is a schematic block diagram of one embodiment of interface circuitry comprising duty cycle measurement circuitry.

FIG. 1B is a schematic block diagram of another embodiment of a circuit 100 comprising interconnect circuitry 101 having a path 110. In the FIG. 1B embodiment, the interface circuitry 101 comprises an ODT circuit 122, which may be configured external input signals. The ODT circuit 122 may be further configured to generate a test input signal 105. The test input signal 105 may be produced by an oscillator and/or other circuitry embodied on the semiconductor 102. The ODT circuit 122 may be configured to produce the test input signal 105 having a particular frequency, period, duty cycle ($D_{OSC}$), duty cycle deterioration ($\Delta T_{OSC}$), and/or the like. The characteristics of the test input signal 105 generated by the interface circuitry 101 may be known and/or verified (e.g., through testing of the fabricated interface circuitry 101). Therefore, $D_{OSC}$ and/or $\Delta T_{OSC}$ of the test input signal 105 may be known.

The circuit 100 may further comprise a duty cycle measurement circuit 130, which may be configured to acquire duty cycle measurements 141 at one or more locations 112 within the path 110. The duty cycle measurement circuit 130 may be configured to acquire the duty cycle measurements 141N while the ODT 122 generates the test input signal 105 and/or while the test input signal 105 is coupled to the input region 111 of the path 110. The duty cycle measurements 141N may be obtained from location 112N, which may comprise signal 114N. The signal 114N may correspond to propagation of the test input signal 105 (having the known $D_{OSC}$ and/or $\Delta T_{OSC}$) to location 112N within the data path 110 (by propagation distance 113N). Accordingly, the duty cycle measurements 141N may correspond to and/or comprise duty cycle metrics $DCM_N$ 162N, which may include, but are not limited to: the duty cycle of the signal 114N ($D_N \approx D_{OUT}$), a high duty cycle pulse of the signal 114N ($D_{H\_N} \approx D_{H\_OUT}$), a low duty cycle pulse of the signal 114N ($D_{L\_N} \approx D_{L\_OUT}$), a duty cycle deterioration of the signal 114N ($\Delta T_N \approx \Delta T_{OUT}$), and/or the like. The duty cycle deterioration characteristics of the interface circuitry 101 may be determined by comparing the known characteristics of the test input signal 105 to the duty cycle measurements 141N (and/or corresponding $DCM_N$ 162N). As illustrated in FIG. 1B, a duty cycle error characteristic for the interface circuitry 101 ($\Delta D_{E\_PATH}$) may be determined by comparing the duty cycle ($D_N$) of the signal 114N to the known duty cycle ($D_{OSC}$) of the test input signal 105 (e.g., $\Delta D_{E\_PATH} \approx D_{OSC\_N} = D_N - D_{OSC}$). A duty cycle deterioration for the interface circuitry 101 ($\Delta T_{E\_PATH}$) may be determined by comparing a duty cycle deterioration ($\Delta T_N$) of the signal 114N at location 112N to the known duty cycle deterioration ($\Delta T_{OSC}$) of the test input signal 105 (e.g., $\Delta T_{E\_PATH} \approx \Delta T_{OSC\_N} = \Delta T_N - \Delta T_{OSC}$).

The duty cycle circuit 130 may be configured to provide the duty cycle measurements 141N to a diagnostic device 160, which may use the duty cycle measurements 141N to determine a DCDC 164 and/or duty cycle correction data 166 for the interface circuitry 101. The DCDC 164 may be determined by comparing the duty cycle measurements 141N to known characteristics of the test input signal 105, as disclosed herein. The duty cycle correction data 166 may be determined to configure duty cycle adjust circuitry 108 to compensate for the determined DCDC 164, as disclosed herein. The duty cycle correction data 166 may be adapted to configure the duty cycle adjust circuitry 108 to compensate for the measured DCDC 164 within the path 110 (e.g., correct for the determined measurements of $\Delta D_{E\_PATH}$ and/or $\Delta T_{E\_PATH}$, as disclosed herein).

Figure 3:
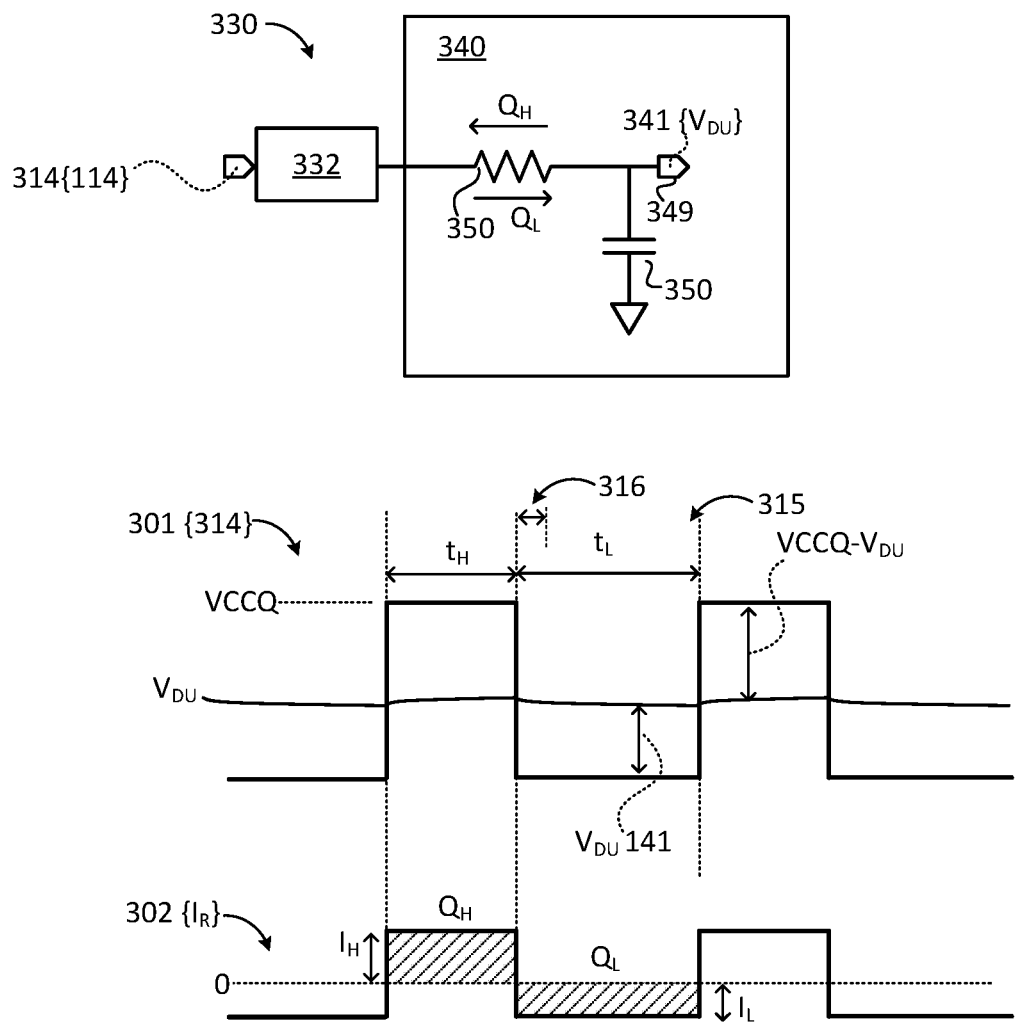
FIG. 3 is a simplified schematic block of one embodiment of duty cycle measurement circuitry.

The duty cycle measurement circuit 130 disclosed herein may be configured to acquire duty cycle measurements 141 using any suitable circuitry, mechanism and/or technique. The duty cycle measurement circuit 130 may be configured to measure the duty cycle of signals being propagated within the interface circuitry 101 by use of duty cycle-to-voltage (DCV) circuitry. FIG. 3 is a schematic block diagram of one embodiment of a simplified DCV circuit 330. The DVC circuit 330 illustrated in FIG. 3 may comprise input circuitry 332 and accumulator circuitry 340. The input circuitry 332 may be configured to selectively connect the DVC circuit 330 to a location and/or position 112 within the interface circuitry 101 (e.g., at a designated distance and/or offset 113 along the path 110). In some embodiments, the input circuitry 332 may comprise switch and/or routing circuitry configured to communicatively couple and/or decouple the accumulator circuitry 340 to selected locations 112 along the path 110 of the interconnect circuitry 101. The input circuitry 332 may be configured to selectively connect the accumulator circuitry 340 to the data path 110 at positions 112 located at either end of the path 110. The input circuitry 332 may be configured to couple the accumulator circuitry 340 to a first location 112 at, within, and/or near the input region 111 of the path 110 (e.g., location 112A) and/or a second location 112 which may be at, within, and/or near the output region 117 of the path 110 (e.g., location 112N). The input circuitry 332 may comprise a switch. Connecting the DVC circuit 330 to the path 110 may comprise activating and/or closing the switch, and disconnecting the DVC circuit 330 from the path 110 may comprise deactivating and/or opening the switch.

The accumulator circuitry 340 may comprise any suitable circuitry for accumulating a charge and/or voltage potential corresponding to the duty cycle of a time-variant and/or oscillating signal 314. The signal 314 may comprise a timing signal (e.g., signal 114) having a high state at an input/output voltage potential (VCCQ) and a low state at $V_0$. VCCQ may be between about 1.2V and 1.8V. In the FIG. 3 embodiment, the accumulator circuitry 340 comprises a resistor 350 and capacitor 360 (a resistor-capacitor (RC) circuit). The signal 314 may comprise a signal 114 at a selected location 112 along the path 110 (e.g., signal 114A at location 112A, signal 114N at location 112N, or the like). Accordingly, the signal 314 may have a duty cycle 315 (D or $t_H + t_L$) and corresponding duty cycle distortion 316 ($\Delta T$, $t_H - \frac{1}{2} t_p$).

FIG. 3 further includes plot 301, which depicts exemplary voltage potentials on the accumulator circuitry 340 in response to the signal 314 (e.g., charge on capacitor 360 when coupled to a selected location 112 along the data path 110). Plot 302 depicts corresponding current flow into and out of the accumulator circuitry 340 during $t_H$ and $t_L$ of the signal 314, respectively ($I_H$ and $I_L$). The accumulator circuitry 340 may have an RC characteristic, which may correspond to a settling time thereof. The accumulator circuitry 340 may be configured such that the RC characteristic thereof is substantially larger than the period of the signal 314 (e.g. $RC >> t_H + t_L$). When connected to receive signal 314, the accumulator circuitry 340 will stabilize, such that the charge $Q_H$ corresponding to time $t_H$ will be substantially equivalent to the charge $Q_L$ corresponding to time $t_L$ (e.g., $Q_H = |Q_L|$, as illustrated in plot 302). Accordingly, current flow into and out of the accumulator circuitry 340 will be substantially balanced:

$$Q_H = I_H * t_H = |Q_L| = |I_L * t_L| \qquad \text{Eq. 3}$$

Based on Eq. 3, the voltage potential $V_{DU}$ 341 on the output node 349 of the DVC 330 may be expressed as a function of $t_H$ and $t_L$ of signal 314 (the duty cycle 315 of signal 314), as follows:

$$\frac{V_{DU}}{R*t_H} = \frac{VCCQ - V_{DU}}{R*t_L} \qquad \text{Eq. 4}$$

In accordance with Eq. 4, the duty cycle characteristics of the signal 31, may be determined from the voltage potential $V_{DU}$ 341 on output node 349, as follows:

$$D_H = \frac{t_H}{(t_H + t_L)} = \frac{VCCQ - V_{DU}}{VCCQ}; D_L = 1 - D_H, \qquad \text{Eq. 5}$$

$$t_H = D_H * t_p; t_L = t_p - t_H,$$

$$\Delta T_H = \frac{t_p}{2} - t_H; \Delta T_L = \frac{t_p}{2} - t_L$$

As illustrated above, the duty cycle 315 of the signal 314 may be determined by: a) providing the signal 314 to the accumulator circuitry 340 (through input circuitry 332), and b) measuring the voltage potential $V_{DU}$ 341 on output node 349 (after a stabilization time, which may correspond to the RC value of the accumulator circuitry 340 and/or period of the signal 314). As illustrated in FIG. 3, the voltage potential $V_{DU}$ 341 on the output node 349 may comprise some degree of variance after the stabilization time (due to, inter alia, oscillation of the signal 314, jitter, noise, variability in the input signal, and/or the like). Accordingly, determining the duty cycle of signal 314 may comprise implementing one or more error mitigation techniques, which may include, but are not limited to: acquiring a plurality of voltage measurements $V_{DU}$ 341 corresponding to the signal 314 (e.g., N measurements of $V_{DU}$ 341); determining an average, mean, and/or median voltage potential of the N measurements; determining a variance and/or deviation of the N measurements; rejecting outlier measurements of the N measurements; and/or the like.

The stabilization time of the accumulator circuitry 340 may correspond to the RC characteristic thereof (e.g., the product of the resistance of resistor 350 and capacitance of capacitor 360). The accumulation circuitry 340 may be configured such that the RC characteristic is substantially larger than the period of the signal 314 (RC>>$t_H$+$t_L$). The signal 114 (received at signal 314 in FIG. 3) may correspond to a timing signal having a period of about 1.875 ns. The accumulator circuitry 340 may have an RC value of about $1.518 \times 10^{-6}$, which may correspond to a resistance of 134.4 k ohms and a 11.3 pF capacitance (and is substantially larger than $1.875 \times 10^{-9}$). Although particular examples of accumulator circuitry 340 and corresponding RC characteristics are described herein, the disclosure is not limited in this regard and could be adapted to use any suitable accumulator circuitry 340 having any suitable RC characteristic (using suitably sized resistive and/or capacitive elements), which may be adapted for measuring the duty cycle of signals 314 having any suitable frequency and/or period.

The duty cycle measurement circuit 130 illustrated in FIG. 1A and/or FIG. 1B may comprise one or more DVC circuits 330. The diagnostic device 160 may configure the duty cycle measurement circuit 130 to acquire differential duty cycle measurements 151, which may include acquiring duty cycle measurements pertaining to the output region 117 (e.g., duty cycle measurements 141N corresponding to path location 112N), and/or acquiring duty cycle measurements pertaining to the input region 111 (e.g., duty cycle measurements 114A corresponding to path location 112A). Configuring the duty cycle measurement circuitry 130 to acquire duty cycle measurements 141N may comprise configuring the duty cycle measurement circuitry 130 to: a) connect the DVC circuit 330 to location 112N along the path 110, and b) measure $V_{DU}$ 341 on output node 349 of the DVC 330 while the test input signal(s) are driven on path 110. Configuring the duty cycle measurement circuit 130 to acquire the duty cycle measurements 141A may comprise configuring the duty cycle measurement circuit 130 to: a) connect the DVC circuit 330 to location 112A along the path 110, and b) measure $V_{DU}$ 341 on output node 349 of the DVC 330 while the test input signal(s) are driven on path 110. The diagnostic device 160 may further configure the duty cycle measurement circuit 130 to communicate the duty cycle measurements 141A and 141N thereto, as disclosed herein. In some embodiments, the diagnostic device 160 may acquire the measurements directly (e.g., the output node 349 comprising $V_{DU}$ 341 may be connected to an input/output pad and/or channel accessible to the diagnostic device 160). The diagnostic device 160 may analyze the duty cycle measurements 141A and/or 141N to determine whether duty cycle deterioration is occurring during signal propagation along the path 110. The diagnostic device 160 may compare the duty cycle measurements 141A and 141N to determine whether the path 110 comprises duty cycle error. As disclosed above, duty cycle degradation may be caused by a number of different, variable factors, such as manufacturing defects, process variations and/or the like. As such, the duty cycle degradation along the path 110 may vary in different manufactures and/or fabrications of the path 110. In some cases, the path 110 within the as-fabricated circuit 100 may not comprise significant duty cycle degradation. If the duty cycle measurements (and/or corresponding metrics 162A and/or 162N) differ by more than a threshold, the diagnostic device 160 may determine that the path 110 comprises duty cycle degradation. Otherwise, the path 110 may be deemed as not comprising duty cycle degradation. As disclosed above, the threshold may correspond to granularity of duty cycle adjustment and/or trim operations capable of being performed by the duty cycle adjust circuitry 108, timing requirements of the interface circuitry 101, and/or the like. The diagnostic device 160 may use the duty cycle measurements 141A and 141N to determine a DCDC 164 for the interface circuitry 101 and/or duty cycle correction data 166 to correct the determined DCDC 164. The diagnostic device 160 may be further configured to record the duty cycle correction data 166 on one or more of the circuit, semiconductor 102, and/or duty cycle adjust circuitry 108, as disclosed herein.

Figure 4A:
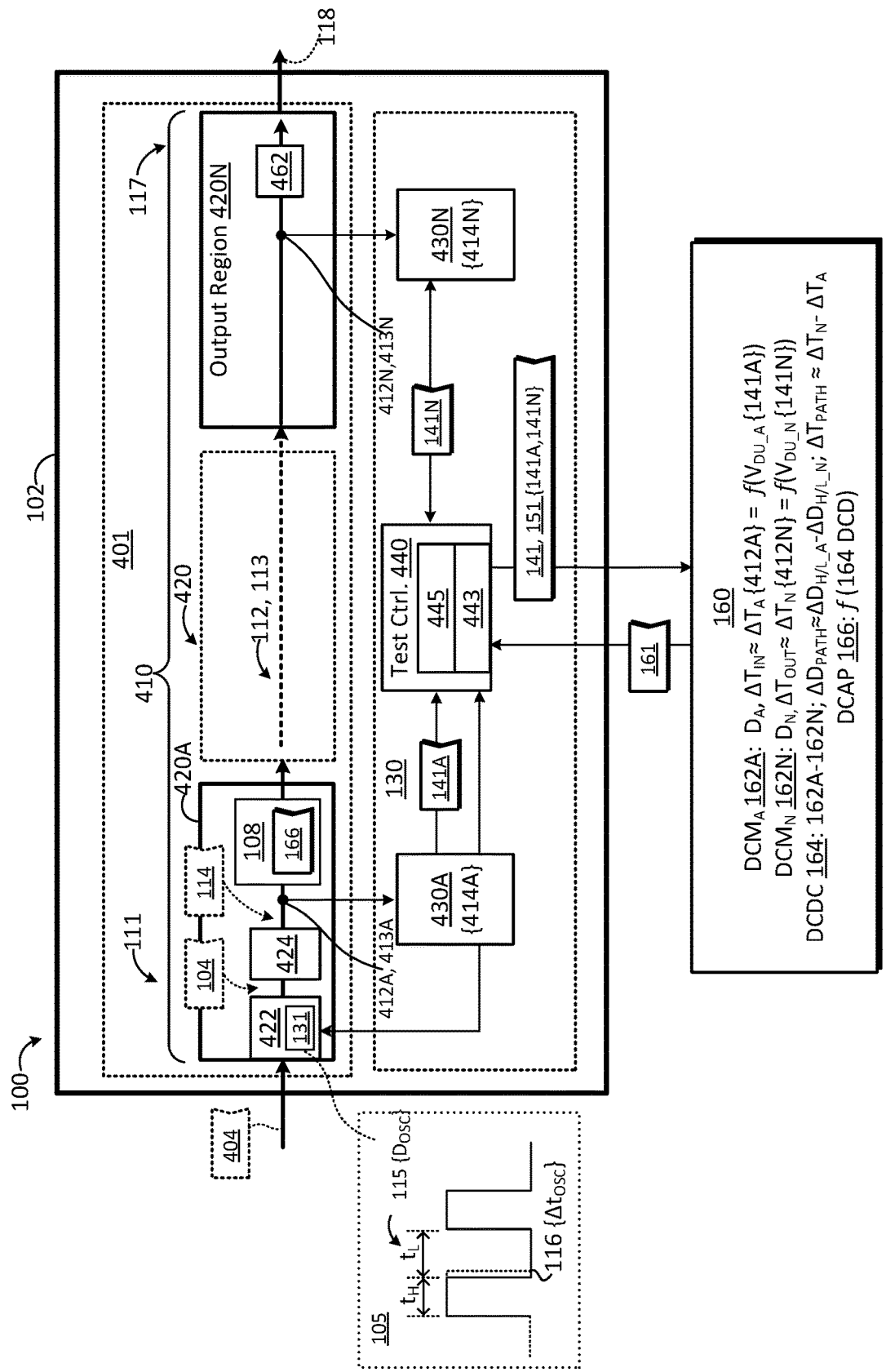
FIG. 4A is a schematic block diagram of another embodiment of duty cycle measurement circuitry.

FIG. 4A is a schematic block diagram of another embodiment of a circuit 100 comprising data output circuitry 401 having a signal path 410. The data output circuitry 401 may be embodied within a circuit structure 102, which may comprise one or more of a semiconductor structure, a semiconductor wafer, a die, a chip, a package, a memory device, a memory chip, a memory package, and/or the like. The signal path 410 may comprise circuitry configured to propagate a signal 114, such as a timing signal, through the data output circuitry 401 (e.g., from the input region 111 towards the output region 117).

In the FIG. 4A embodiment, the signal path 410 may comprise a plurality of regions 420 including an input region 420A and an output region 420N. The data output circuitry 401 may be configured to propagate a signal 114 along a signal path 410 in response to receiving an input 104 (at input region 420A), and may use the signal 114 to produce data output signals 118 (at output region 420N). The input region 420A may comprise ODT circuitry 422 and input receiver circuitry 424. The ODT circuitry 422 may be configured to receive external input signals 404 (e.g., input signals 104 originating externally to the circuit structure 102). Alternatively, or in addition, the ODT circuitry 422 may be configured to receive and/or generate test input signal 105. In the FIG. 4A embodiment, the ODT circuitry 422 comprises a signal generator 131, which may be configured to generate test input signals 105 for use in analyzing the duty cycle characteristics of the data output circuitry 401, as disclosed herein.

The input region 420A may further comprise input receiver circuitry 424, which may be configured to receive input signal 104 from the ODT circuitry 422 and propagate a corresponding signal 114 along the signal path 410. The input receiver circuitry 424 may be configured to process and/or manipulate the signal 114 (e.g., buffer the signal 114, filter the signal 114, amplify the signal 114, and/or the like). Alternatively, or in addition, the input receiver circuitry 424 may derive one or more internal signals from the signal 114 (e.g., may comprise differential circuitry to derive an inverse of the signal 114).

The data output region 420N may comprise circuitry configured to produce a data output signal 118 by use of the signal 114 (e.g., signal 414N within output region 420N). The data output region 420N may comprise data strobe circuitry 462, which may be configured to generate data output signals 118 comprising output data. The output data may correspond to data stored in a memory and/or accessed by use of memory circuitry (not shown to avoid obscuring the details of the disclosed embodiments). Alternatively, or in addition, the output data may comprise test output data, such as an "FF" data pattern. The data output region 420N may comprise data strobe circuitry configured to encode the output data as one or more of data strobe signals (DQS signals) and/or inverse or differential data strobe signals (BDQS signals). Generating the DQS and/or BDQS signals may comprise combining the output data with the signal 114 (e.g., signal 114N as propagated to the output region 420N). A DQS and/or BDQS data signal may comprise a combination of the output data and the signal 114 (and/or inverse thereof), such that the output data is encoded as respective data and strobe signals having the property that only one of the data signal and the strobe signal is allowed to change its state during a given cycle of the timing signal (e.g., signal 114N). A logical combination of the resulting data and strobe signals may result in reconstructing the timing signal used to produce the strobe signals (e.g., reconstruct signal 414N through an XOR logical combination of the data and strobe signals). Accordingly, the duty cycle ($D_N$) and/or duty cycle distortion ($\Delta T_N$) of the signal 114N at path location 112A or propagation distance 113N may determine timing characteristics of the output data 118. Therefore, the duty cycle ($D_N$) and/or duty cycle distortion ($\Delta T_N$) of the signal 114N at path location 112A or propagation distance 113N may comprise and/or correspond to the output duty cycle ($D_{OUT}$) and/or output duty cycle distortion ($\Delta T_{OUT}$) of the signal path 410.

The circuit 400 may comprise a duty cycle measurement circuit 130, which may be configured to acquire differential duty cycle measurements 151, including duty cycle measurements 141A and 141N at respective locations 412A and 412N along the signal path 410 (and/or propagation offsets 413A and 413N), as disclosed herein. The duty cycle measurement circuit 130 of the FIG. 4A embodiment may comprise and/or be communicatively coupled to a test controller 440, a first measurement circuit 430A, and a second measurement circuit 430N. The first measurement circuit 430A may be configured to acquire duty cycle measurements 141A corresponding to location 412A along the signal path 410. The location 412A may be within the input region 420A of the signal path 414 (and at propagation distance 413A from the input region 111 of the signal path 410). The location 412A may correspond to the input receiver circuitry 424 (and/or an output thereof). Accordingly, the duty cycle ($D_A$) and/or duty cycle distortion ($\Delta T_A$) of the signal 414A at location 412A may correspond to an initial or input duty cycle ($D_{IN}$) and/or duty cycle distortion ($\Delta T_{IN}$) for duty cycle measurement operations on the signal path 410.

The second measurement circuit 430N may be configured to acquire duty cycle measurements 141N corresponding to location 412N along the signal path 410. The location 412N may be within the output region 420N of the signal path 410 (at propagation distance 413N along the signal path 410). The location 412N may correspond to the data strobe circuitry 462 (and/or an output thereof). Accordingly, the duty cycle ($D_N$) and/or duty cycle distortion ($\Delta T_N$) of the signal 414N at location 412N may comprise the output duty cycle ($D_{OUT}$) and/or output duty cycle distortion ($\Delta T_{OUT}$) for duty cycle measurement operations on the signal path 410.

The test controller 440 may be communicatively coupled to a diagnostic device 160. The test controller 440 may be communicatively coupled to the diagnostic device 160 using any suitable means disclosed herein. In the FIG. 4A embodiment, the test controller 440 may be communicatively coupled to the diagnostic device 160 through, inter alia, a test interface 443. The test interface 443 may comprise circuitry for communicating signal(s) to and/or from the semiconductor 102 and/or circuit 100. The test interface 443 may include, but is not limited to: one or more ODT circuits, one or more probes, one or more input/output pads, one or more input/output pins, one or more input/output wires, one or more semiconductor vias, and/or the like. The test interface 443 may be configured to receive command signals 161 from the diagnostic device 160 and/or communicate the differential duty cycle measurements 151 (e.g., duty cycle measurements 141A, 141N, and/or other information) to the diagnostic device 160. The command signals 161 may configure the duty cycle measurement circuit 130 to: acquire duty cycle measurements 141 (e.g., differential duty cycle measurements 151, including measurements 141A and 141N); perform duty cycle measurement operations; couple one or more of the first measurement circuit 430A and second measurement circuit 430N to the signal path 410 to acquire duty cycle measurements 141 therefrom; couple the output node 349 comprising the $V_{DU}$ voltage potential 341 to one or more input/output pads (e.g., probe 443) in order to, inter alia, enable the diagnostic device 160 to obtain duty cycle measurements 141 directly from an output node 349 of one or more of the first measurement circuit 430A and second measurement circuit 430N; configure the signal generator 131 to generate test input signals 105; and/or the like.

The test interface circuitry 443 may be configured to route and/or drive internal signals 445 corresponding to the command signals 161. The internal signals 445 may comprise enable signals, disable signals, configuration signals (e.g., duty cycle correction data 166), and/or the like. The internal signals 445 may be used to configure elements of the circuit 100 to perform duty cycle measurement and/or analysis operations, as disclosed herein.

The command signals 161 may configure the circuit 100 to implement a duty cycle measurement and/or analysis operation, which may comprise: a) applying test stimulus to the signal path 410, b) configuring the first measurement circuit 430A to obtain first duty cycle measurements 141A corresponding to location 412A (and/or propagation distance 413A) while the test stimulus is being applied to the signal path 410 (and/or after a settle time from the stimulus being applied), c) configuring the second measurement circuit 430N to obtain second duty cycle measurements 141N corresponding to location 412N (and/or propagation distance 413N) while the test stimulus is being applied to the signal path 410 (and/or after a settle time of the test stimulus being applied), and/or the like. Applying the test stimulus to the signal path 410 may comprise configuring the ODT circuitry 422 to: a) generate a test input signal 105, which may comprise forming internal signals 445 configured to cause the signal generator 131 to produce the test input signal 105; b) configure the ODT circuitry 422 to use the test input signal 105 as an input 104 to the signal path (and/or disconnect the signal path 410 from external input signal(s) 404); c) configure output circuitry to provide test output data to the output region 420N (e.g., an "FF" data pattern); and so on. Configuring the first measurement circuit 430A to acquire the first duty cycle measurements 141A may comprise producing internal signals 445 configured to a) cause the first measurement circuit 430A to connect to path location 412A, b) route the signal 414A at path location 412A to accumulator circuitry 340 thereof, and/or c) acquire measurement(s) 141A of the voltage potential $V_{DU}$ 341 on the output node 349 thereof (and/or provide the measurement(s) 141A to the diagnostic device by, inter alia, sending the measurements 141A to the diagnostic device, coupling probe circuitry to the output node 349 of the first measurement circuit 430A, and/or the like). Configuring the second measurement circuit 430A to acquire the second duty cycle measurements 141N may comprise forming internal signals 445 configured to a) cause the second measurement circuit 430N to connect to path location 412N, b) route the signal 414N at path location 412N to accumulator circuitry 340 thereof, and/or c) acquire measurement(s) 141N of the voltage potential $V_{DU}$ 341 on the output node 349 thereof (and/or provide the measurement(s) 141N to the diagnostic device by, inter alia, sending the measurements 141N to the diagnostic device, coupling probe circuitry to the output node 349 of the first measurement circuit 430N, and/or the like).

Alternatively, or in addition, the test controller 440 may be configured to manage duty cycle measurement and/or analysis operations. The test controller 440 may be configured to assert internal signals 445 to configure the circuit 100 to: acquire first duty cycle measurements 141A (by use of the first measurement circuit 430A), acquire second duty cycle measurements 141N (by use of the second measurement circuit 430N), and communicate the acquired duty cycle measurements 141 (e.g., 141A and 141N) to the diagnostic device 160. The test controller 440 may be configured to obtain a predetermined number of duty cycle measurements 141 at specified locations 112 along the signal path 410, process the duty cycle measurements 141 (e.g., determine statistical properties of duty cycle measurements 141), and so on. In these embodiments, the test controller 440 may comprise control circuitry, logic circuitry, state machine circuitry, firmware, configuration data, and/or the like.

The first measurement circuit 430A may comprise a DVC circuit 330, as disclosed herein. Acquiring the first duty cycle measurements 141A may, therefore, comprise a) configuring input circuitry 332 of the first measurement circuit 430A to connect the accumulator circuitry 340 thereof to path location 412A, such that the accumulator circuitry 340 receives signal 414A propagating within the input region 420A of the signal path 410, and b) acquiring measurements 141A, which may comprise measurements of the voltage potential ($V_{DU}$) 341 on the output node 349 of the accumulator circuitry 340 (after stabilization of the accumulator circuitry 340). The test controller 440 may be configured to obtain a plurality of duty cycle measurements 141A (five or more measurements of $V_{DU}$ 341), determine characteristics of the acquired measurements 141A, process the acquired measurements 141A (e.g., reject outliers of the acquired measurements 141A), and so on, as disclosed herein.

The second measurement circuit 430N may comprise a DVC circuit 330, as disclosed herein. Acquiring the second duty cycle measurements 141N may, therefore, comprise a) configuring input circuitry 332 of the second measurement circuit 430N to connect the accumulator circuitry 340 thereof to path location 412N, such that the accumulator circuitry 340 receives signal 414N propagating within the output region 420N of the signal path 410, and b) acquiring measurements 141N, which may comprise measurements of the voltage potential ($V_{DU}$) 341 on the output node 349 of the accumulator circuitry 340 thereof (after stabilization of the accumulator circuitry 340). The test controller 440 may be configured to obtain a plurality of duty cycle measurements 141N (e.g., five or more measurements 141N of $V_{DU}$ 341), determine characteristics of the acquired duty cycle measurements 141N, process the acquired measurements 141N (e.g., reject outliers of the acquired measurements 141N), and so on, as disclosed herein.

In some embodiments, the first measurement circuit 430A and the second measurement circuit 430N are configured to obtain duty cycle measurements 141A and 141N substantially concurrently (e.g., the first measurement circuit 430A may be communicatively coupled to the signal path 410 at location 412A to acquire duty cycle measurements 141A, while the second measurement circuit 430N is communicatively coupled to the signal path 410 at location 412N to acquire duty cycle measurements 141N). Alternatively, the first measurement circuit 430A and the second measurement circuit 430N may be configured to obtain duty cycle measurements separately (e.g., the first measurement circuit 430A may be disconnected from the signal path 410 while the second measurement circuit 430N is connected to the signal path 410 to obtain duty cycle measurements 141N, and vice versa). In some embodiments, the first measurement circuit 430A and the second measurement circuit 430N share one or more resistive and/or capacitive elements (e.g., are embodied as a single DVC circuit 330, share a capacitive element, and/or the like).

In some embodiments, the test controller 440 may be configured to analyze the measurements 141A and 141N, which may comprise comparing the measurements 141A and 141N, and using the measurements 141A and 141N to determine a measure of the DCDC 164 of the signal path 410, determine duty cycle correction data 166 for the measured DCDC 164, and/or configure the duty cycle adjust circuitry 108 to compensate for the measured DCDC 164

(e.g., by generating duty cycle correction data 166 to configure the circuitry 100 to compensate for the measured duty cycle errors within the path 410). Alternatively, or in addition, the duty cycle measurements 141 may be analyzed at the diagnostic device 160. The test controller 440 may communicate the duty cycle measurements 141 to the diagnostic device 160, which may use the duty cycle measurements to determine the DCDC 164 of the signal path 410 and/or derive corresponding duty cycle correction data 166, as disclosed herein. The test controller 440 may be further configured to receive duty cycle correction data 166 from the diagnostic device 160 and/or configure the duty cycle adjust circuitry 108 to use the duty cycle correction data 166 during operation of the circuit 100.

Figure 4B:
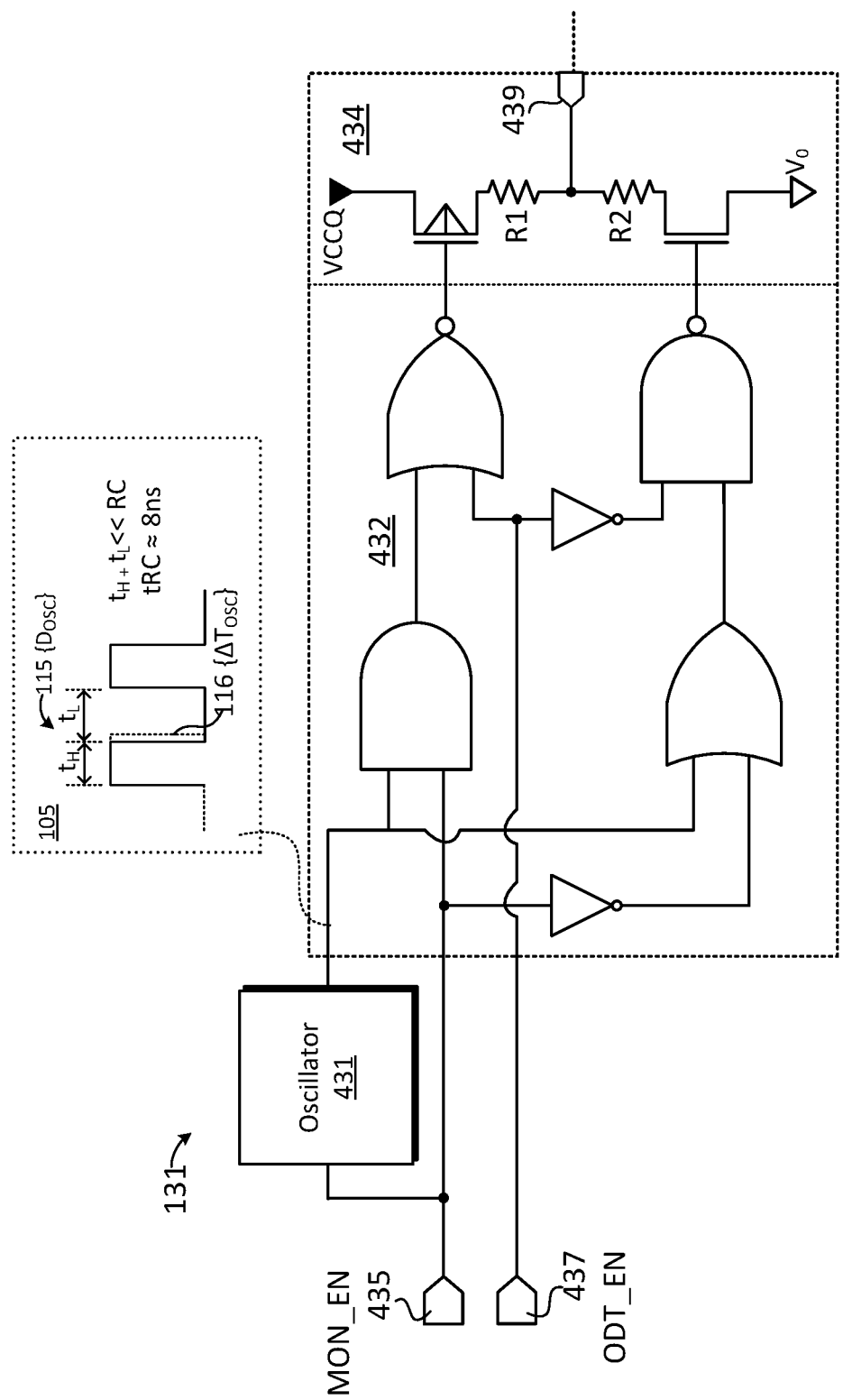
FIG. 4B is a schematic block diagram of one embodiment of a signal generator for duty cycle measurement and/or analysis.

As disclosed above, acquiring the duty cycle measurements 141 and/or differential duty cycle measurements 151 (measurements 141A and 141N) may comprise configuring the ODT circuitry 422 to generate a test input signal 105 and/or couple the test input signal 105 to the signal path 410 (by use of internal signal(s) 445). FIG. 4B is a schematic block diagram depicting one embodiment of a signal generator 131, which may be configured to selectively generate test input signals 105 and/or couple such test input signals 105 to the signal path 410, as disclosed herein. The signal generator 131 may be included in the ODT circuitry 422 of FIG. 4A (and/or ODT circuitry 122 of FIG. 1B). Alternatively, the signal generator 131 may be embodied separately (e.g., as a component of the duty cycle test circuit 130, as illustrated in FIG. 1A). The signal generator 131 may comprise oscillator circuitry 431, which may be configured to produce a test input signal 105. The test input signal 105 may have a duty cycle 115 ($D_{OSC}$) and duty cycle distortion ($\Delta T_{OSC}$). The output of the oscillator circuitry 431 may flow to logic circuitry 432, which may configure drive circuitry 434 to selectively drive the output node 439 of the generator 131 with the test input signal 105 based on, inter alia, internal signals 445, including a MON_EN signal 435 and ODT_EN signal 436. When the MON_EN signal 435 is asserted, the logic circuitry 432 causes the drive circuitry 434 to drive the output node 439 with the test input signal 105 (by use of PMOS and NMOS transistors connected between VCCQ and $V_0$ through resistors R1 and R2). When the MON_EN signal 435 is asserted, the ODT circuitry 422 may be further configured to output the test output signal 105 for propagation along the data path 410 rather than external signal(s) 404 received thereby.

Figure 5A:
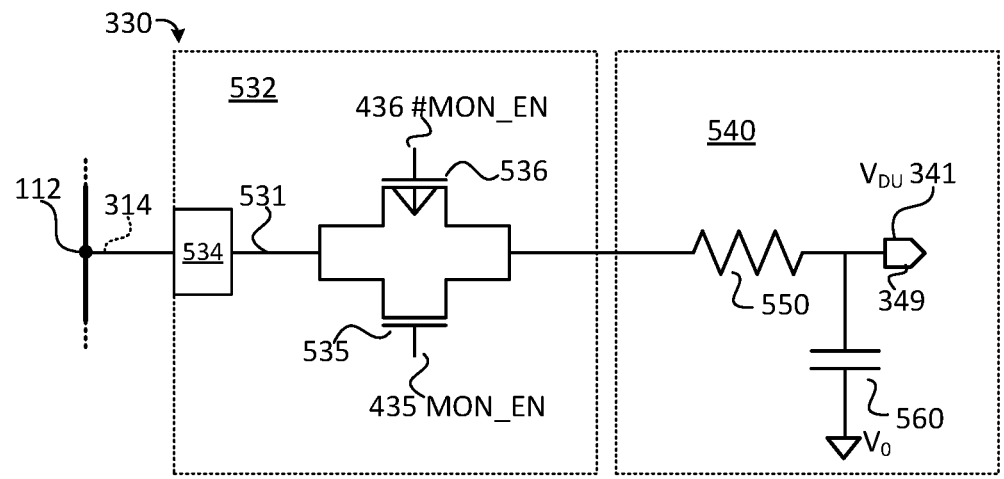
FIG. 5A is a schematic block diagram of one embodiment of a duty cycle measurement circuit.

Referring back to FIG. 4A, the first measurement circuitry 430A and/or second measurement circuit 430N may comprise a DVC circuit 330. The DVC circuit 330 illustrated in FIG. 3 may be susceptible to measurement errors due to, inter alia, voltage variations, inconsistent source current and/or voltage, and/or the like. FIG. 5A depicts another embodiment of a DVC circuit 330, which may be configured to acquire highly accurate duty cycle measurements 141. The DVC circuit 330 of FIG. 5A may comprise control circuitry 532 and accumulator circuitry 540. In some embodiments, the control circuitry 532 comprises and/or is communicatively coupled to routing circuitry 534. The routing circuitry 534 may be configured to selectively route a signal 314 to the input node 531 of the DVC 330, which may comprise selectively connecting the input node 531 to a designated path location(s) 112 within interconnect circuitry 101 and/or data output circuitry 401, as disclosed herein. Alternatively, the connection to the path location 112 may be controlled by transistors 535 and 536.

The control circuitry 532 may comprise control circuitry to selectively connect (and disconnect) the input node 531 and accumulator circuitry 540 to a designated path location 112 based on internal signals 445, including a MON_EN signal 435 (and an inverse thereof, #MON_EN signal 436). The control circuitry 532 may connect the input node 531 to the accumulator circuitry 540 through transistors 535 and 536. The gate of the first transistor 535 may be coupled to the MON_EN signal 435, and the gate of the second transistor 536 may be coupled to the #MON_EN signal 436. When the MON_EN signal 435 is asserted (and the #MON_EN signal 436 is deasserted), the input node 531 may be connected to the path location 112 to receive signal 314 thereon (through routing circuitry 534). The signal 314 may flow to the accumulator circuitry 540 and produce a voltage potential $V_{DU}$ 341 on the output node 349. The accumulator circuitry 540 may comprise an RC circuit comprising resistive and capacitive circuitry. In the FIG. 5A embodiment, the accumulator circuitry 540 comprises a resistor 550 and capacitor 560. A first terminal of the capacitor 560 may be coupled to voltage potential $V_0$ (e.g., through a common node, a ground node, a VDD node, and/or the like). A second terminal of the capacitor 560 may be coupled to the output node 349 of the DVC 330 and resistor 550. Accordingly, when the MON_EN signal 435 is asserted (and the #MON_EN signal 436 is deasserted), the signal 314 may be received at the second terminal of the capacitor 360 through resistor 550.

As disclosed above, when the accumulator circuitry 540 receives signal 314, the voltage potential $V_{DU}$ 341 on the output node 349 may correspond to a duty cycle of the signal 314. Duty cycle measurements corresponding to the signal 314 may, therefore, be acquired by measuring the voltage potential $V_{DU}$ 341 on the output node 349 while the accumulator circuitry 540 is communicatively coupled to the path location 112 to receive the signal 314 (e.g., communicatively coupled to path 110, data path, signal path 410, and/or the like as disclosed herein). The accumulator circuitry 540 may have an RC characteristic, which may correspond to the resistance and/or capacitance thereof (e.g., the resistance of resistor 550 and capacitance of capacitor 560). The accumulator circuitry 540 may be configured such that the RC value thereof is greater than the period of the signal 314 received thereby (e.g., substantially larger than the period of signal 314, such that $RC \gg t_p$ or $t_H + t_L$). The signal 314 may correspond to a signal 114 within the path 110, the signal path 410, and/or the like. The signal 314 may, therefore, comprise a timing signal, clock signal, read enable signal, differential signal, inverse timing signal, inverse clock signal, inverse read enable signal, and/or the like. The signal 314 may have a period ($t_p$) of about 1.875 ns (e.g., $t_p = t_H + t_L = 1.875$ ns). The accumulator circuitry 540 of the DVC 330 may be configured such that the RC value thereof is substantially larger than $t_p$ (e.g., substantially larger than 1.875 ns). In the FIG. 5A embodiment, the resistor 550 may have a resistance value of about 134.4 k ohms, and the capacitor may have a capacitance of about 11.3 pF, which may correspond to an RC value of about $1.518 \times 10^{-6}$, which is substantially larger than $1.875 \times 10^{-9}$ (the $t_p$ of signal 314). The use of a high resistance value in resistor 550 may enable the size of the transistors 535 and 536 to be reduced (due to, inter alia, the relatively low currents flowing within the DVC 330), which may reduce the layout, power consumption, and/or latency overhead of the duty cycle measurement circuit 130. In the FIGS. 5A and 5B embodiments, the transistors 535 and/or 536 may have a layout size of about 5 to 10 um, and the duty cycle circuit 130 may have a layout size of about 25 by 10 um.

Although specific examples of DVC circuits 330 comprising accumulator circuitry 340 having particular RC values are described herein, the disclosure is not limited in this regard and could be adapted to use any suitable type of accumulator circuitry 340 for acquiring duty cycle measurements 141 corresponding to signals having any suitable frequency and/or period (and having any suitable RC value through the use of, inter alia, suitably configured resistive and/or capacitive elements).

As disclosed herein, the voltage potential on the output node 349 may correspond to the duty cycle of the signal 314. Accordingly, duty cycle measurements 141 corresponding to the duty cycle of signal 314 may be acquired by measuring the voltage potential $V_{DU}$ 341 on output node 349 while the signal 314 is being received at the accumulator circuitry 540 (through control circuitry 532 and/or routing circuitry 534). As disclosed above, acquiring the duty cycle measurements 141 may comprise acquiring a plurality of measurements of the voltage potential $V_{DU}$ 341 while the signal 314 is being received at the accumulator circuitry 540 (e.g., acquiring N measurements of the voltage potential $V_{DU}$ 341 on output node 349). The duty cycle measurements 141 may be acquired after a settling time ($t_s$). The settling time ($t_s$) may correspond to the RC value of the accumulator circuitry 540 and/or period of the signal 314, as disclosed herein. Acquiring the duty cycle measurements 141 may further comprise processing and/or analyzing the measurements 141, which comprises, but is not limited to: acquiring a particular number of measurements of the voltage potential $V_{DU}$ 341 on the output node 349 (e.g., N measurements, where N is five or more); determining one or more statistical properties of the N measurements (e.g., determining an average, mean, median, variance and/or deviation of the N measurements); identifying and/or removing outliers of the N measurements (e.g., based on statistical properties of the N measurements); and/or the like. The duty cycle measurements 141 obtained using the duty cycle circuit 330 of FIG. 5A may result in minimal duty cycle measurement error (e.g., less than about 15 ps).

Figure 5B:
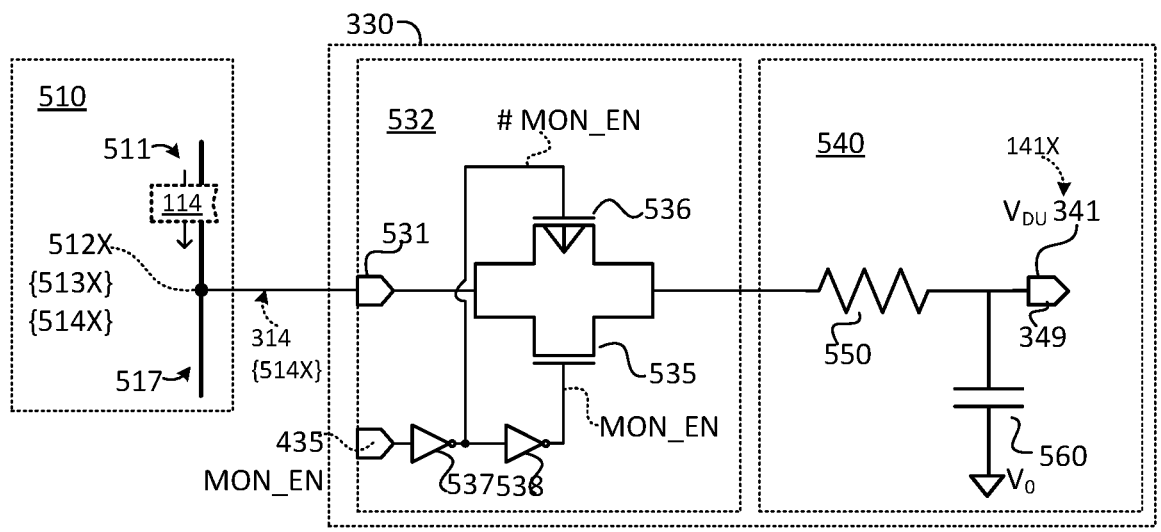
FIG. 5B is a schematic block diagram of another embodiment of a duty cycle measurement circuit.

FIG. 5B depicts another embodiment of the DVC circuit 330 disclosed herein. In the FIG. 5B embodiment, the control circuitry 532 receives internal signals 445, including MON_EN signal 435, which flows through inverters 537 and 538. The output of inverter 537 corresponds to an inverse of the MON_EN signal 435 (e.g., #MON_EN) and is coupled to the gate of transistor 536. The output of inverter 538 corresponds to the MON_EN signal 435 and is coupled to the gate of transistor 535. The transistor 535 may comprise a PMOS transistor, and the transistor 536 may comprise an NMOS transistor.

The input node 531 of the DVC circuit 330 may be coupled to a particular location 512X within a timing path 510. The timing path 510 may comprise and/or correspond to the path 110 of the interconnect circuitry 101 (as illustrated in FIGS. 1A and 1B), the path 410 of the data output circuitry 401, a data output path (e.g., data path 610, 710, and/or 810 of FIGS. 6A, 7, and/or 8A), and/or the like. The timing path 510 may be configured to communicate timing signals within the circuit 100, interface circuitry 101, data path circuitry, and/or the like. The timing signals communicated along the timing path 510 may comprise the signal 114, as disclosed herein, which may comprise one or more of a clock signal, an inverted clock signal, a read enable signal, an inverse read enable signal, a data strobe signal, an inverse data strobe signal, and/or the like.

The location 512X within the timing path 510 may correspond to a propagation distance 513X along the timing path 510. The location 512X may correspond to any suitable location along the timing path 510 (e.g., a location at or near an input region 511 of the timing path 510, such as location 112A and/or 414A, a location at or near an output region 517 of the timing path 510, such as location 112N and/or 414N, and/or the like). The location 512X may comprise signal 514X. The signal 514X may correspond to propagation of signal 114 within the timing path 510, as disclosed herein (e.g., propagation of signal 114 to location 512X within timing path 510, and/or propagation of signal 114 along propagation distance 513X within the timing path 510). The signal 514X may have a duty cycle $D_x$ and duty cycle deterioration $\Delta T_x$ (which may correspond to $t_H$ and $t_L$, wherein $t_H+t_L$ is the period $t_P$ of the signal 514X).

When the MON_EN signal 435 is deasserted, the accumulator circuitry 540 may be disconnected and/or isolated from the timing path 510 (and signal 514X). When the MON_EN signal 435 is asserted, the control circuitry 532 (e.g., transistors 556 and 536) may connect the accumulator circuitry 540 to location 512X within the timing path 510. While connected to location 512X, the signal 514X corresponding to location 512X may be received at the accumulator circuitry 540 (e.g., the signal 514X flow to the second terminal of capacitor 560 through resistor 550). Accordingly, when the MON_EN signal 435 is asserted, the voltage potential $V_{DU}$ 341 on the output terminal 349 may correspond to the duty cycle $D_x$ and/or duty cycle deterioration $\Delta T_x$ of the signal 514X at location 512X (and/or propagation distance 513X) along the timing path 510. Duty cycle measurements 141X corresponding to the signal 514X may be acquired by obtaining one or more measurements of the voltage potential $V_{DU}$ 341 on the output terminal 349 (while the MON_EN signal 435 is asserted), as disclosed herein. Acquiring the duty cycle measurements 141X may comprise obtaining one or more measurements of the voltage potential $V_{DU}$ 341 (e.g., N measurements) and/or performing one or more error mitigation operations on the measurements, as disclosed herein.

Figure 5C:
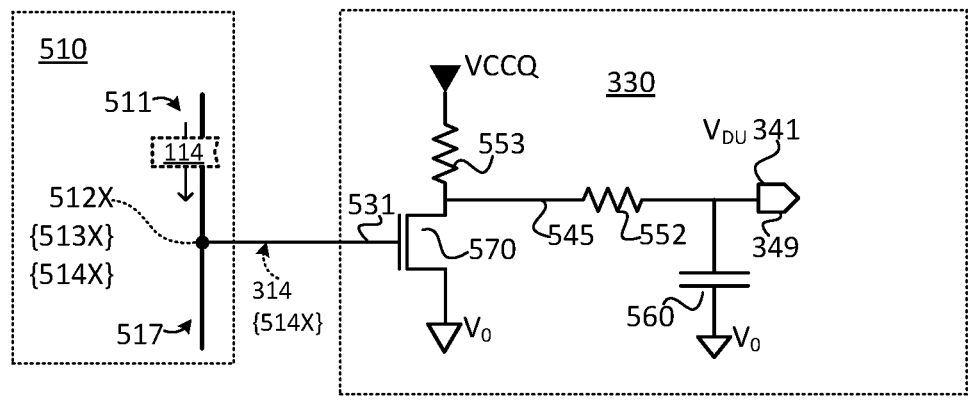
FIG. 5C is a schematic block diagram of another embodiment of a duty cycle measurement circuit.

FIG. 5C depicts another embodiment of a DVC circuit 330. In the FIG. 5C embodiment, the DVC circuit 330 may be connected to the location 512X of the timing path 510 through a transistor 570. The gate of the transistor 570 may be coupled to the input node 531 (and/or location 512X of the timing path 510). The signal 314 received at the DVC circuit 330 may comprise signal 514X, which, as disclosed above, may correspond to propagation of signal 114 to location 512X (and/or propagation distance 513X) along the timing path 510. A drain terminal of the transistor 570 may be coupled to $V_O$. A source terminal of the transistor may be coupled to node 545, which may be coupled to VCCQ through resistor 553 and to capacitor 560 through resistor 552. When the signal 314 is asserted (during $t_H$ of signal 514X), charge may accumulate on capacitor 560 (from VCCQ and through resistors 553 and 552), and when the signal 314 is deasserted (during $t_L$ of signal 514X), the capacitor 560 may discharge. The voltage potential $V_{DU}$ 341 on the output node 349 may, therefore, correspond to a duty cycle of signal 314 (duty cycle $D_x$ of signal 514X).

Figure 5D:
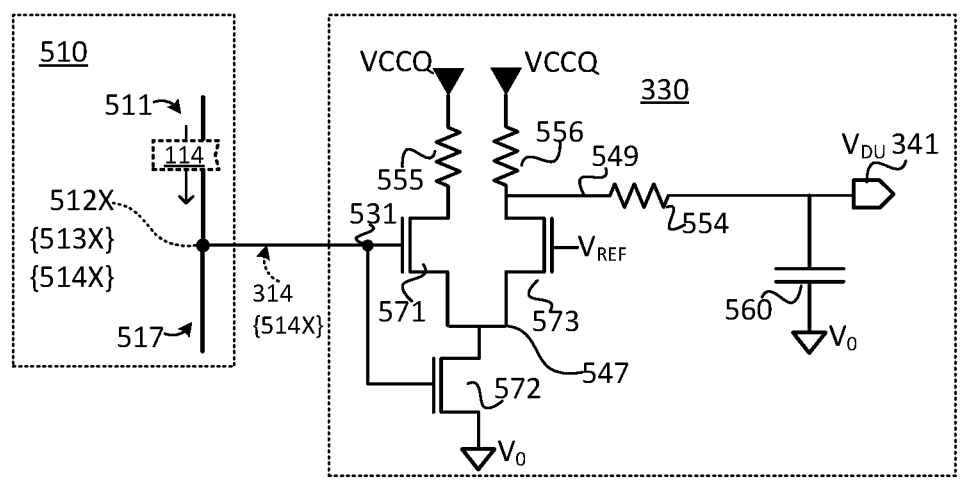
FIG. 5D is a schematic block diagram of another embodiment of a duty cycle measurement circuit.

FIG. 5D depicts another embodiment of a DVC circuit 330. In the FIG. 5D embodiment, the input node 531 may be connected to location 512X within the timing path 510. The input node 531 may be connected to the gate of transistor 571 and the gate of transistor 572. As illustrated in FIG. 5D, the source terminal of transistor 571 may be coupled to VCCQ through resistor 555. The drain terminal of transistor 571 may be coupled to node 547. The source terminal of transistor 572 may be coupled to node 547. The drain terminal of transistor 572 may be coupled to voltage $V_0$. The drain terminal of transistor 573 may be coupled to node 547. The gate of the transistor 573 may be coupled to a reference voltage $V_{REF}$. The source terminal of the transistor 573 may be coupled to node 549. Node 549 may be coupled to VCCQ through resistor 556 and to capacitor 560 through resistor 554. As in the DVC circuit 330 of the FIG. 5C embodiment, when the input signal 314 is asserted (during $t_H$ of signal 514X), charge may accumulate on capacitor 560, and when the input signal 314 is deasserted (during $t_L$ of signal 514X), the capacitor 560 may discharge. The voltage potential $V_{DU}$ 341 on the output node 349 may, therefore, correspond to a duty cycle of the signal 314 (duty cycle $D_x$ of signal 514X).

Figure 6A:
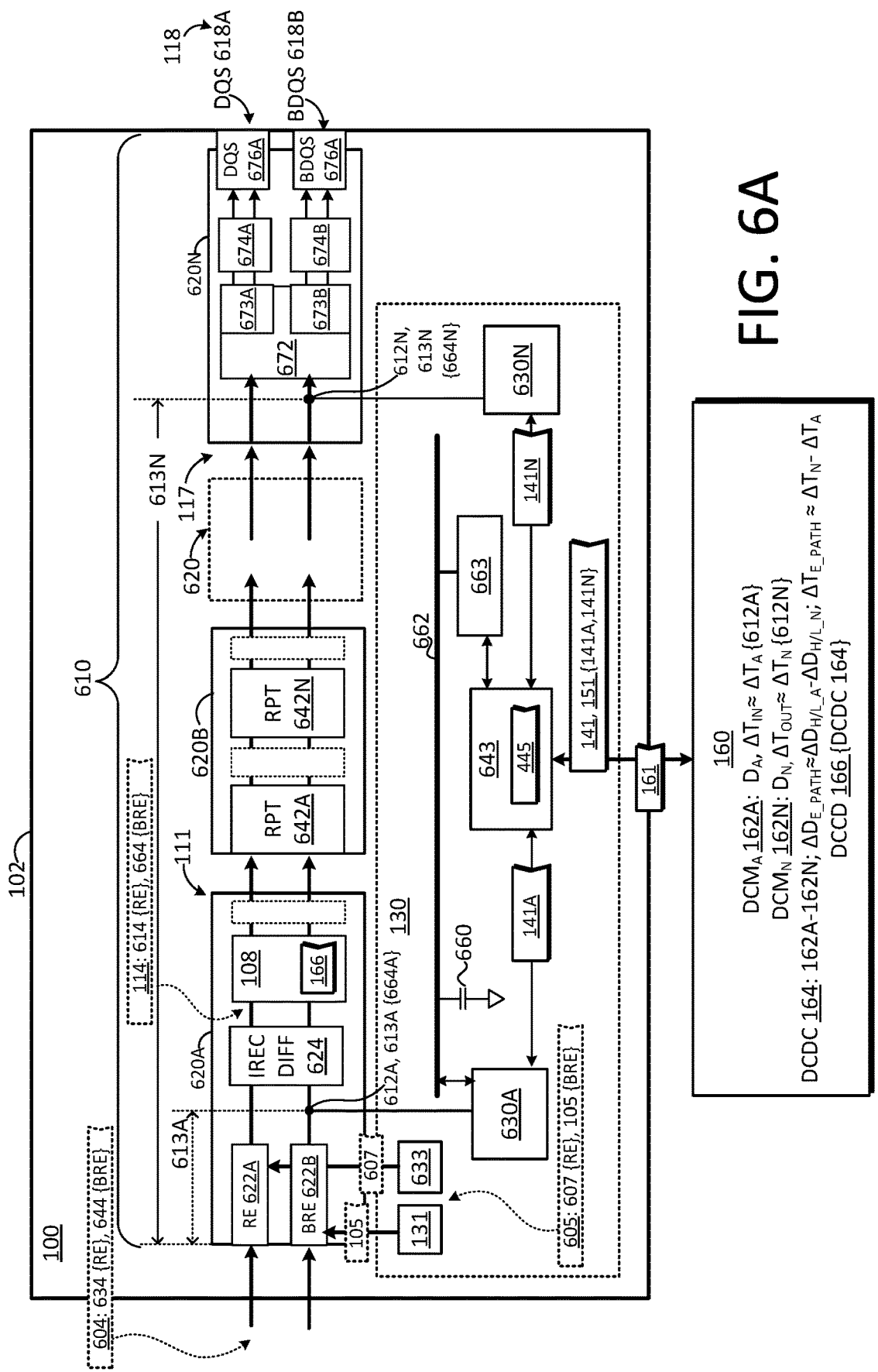
FIG. 6A is a schematic block diagram of one embodiment of a data path comprising a duty cycle measurement circuit.

FIG. 6A is a schematic block diagram of an embodiment of a data path 610 comprising duty cycle measurement and compensation circuitry. In the FIG. 6A embodiment, the circuit 100 comprises a data path 610 comprising a sequence of stages 620, from an input stage 620A to an output stage 620N. The data path 610 may be configured to propagate signals 114 from the input stage 620A toward the output stage 620N. Circuitry comprising the data path 610 may be embodied on a semiconductor 102, as disclosed herein.

The input stage 620A of the data path 610 may be configured to receive external inputs 604, which may include an external read enable (RE) input 634 and an external inverse and/or differential read enable input (BRE) input 644. The RE input circuitry 622A may be configured to receive the external RE input 634, and the BRE input circuitry 622B may be configured to receive the external BRE input 644. The RE input circuitry 622A and/or BRE input circuitry 622B may comprise respective input/output circuitry, such as ODT circuitry, buffer circuitry, sense circuitry, driver circuitry, and/or the like. The RE input circuitry 622A and/or BRE input circuitry 622B may be further configured to receive test stimulus 605, as disclosed in further detail herein.

The input stage 620A may be further configured to propagate a signal 114 along the data path 610 (through the stages 620A of the data path 610) in response to one or more inputs received at the RE input circuitry 622A and/or BRE circuitry 622B. The input receiver circuitry 624 may be configured to process, manipulate, and/or derive signal 114 for communication within the data path 610. The signal 114 may comprise and/or correspond to inputs received at the RE input circuitry 622A and/or BRE input circuitry 622B. In the FIG. 6A embodiment, the signal 114 comprises an RE signal 614 and a BRE signal 664. The RE signal 614 may comprise and/or correspond to a voltage signal, a probe signal, or a timing signal, such as a clock signal, an RE timing signal, an RE clock signal, and/or the like. The BRE signal 664 may comprise and/or correspond to a voltage signal, a probe signal, an inverse and/or differential RE signal, an inverse and/or differential timing signal, a BRE timing signal, a BRE clock signal, and/or the like. The RE signal 614 and BRE signal 664 may comprise separate signals. In some embodiments, the RE signal 614 and the BRE signal 664 may be propagated through separate regions, stages, circuitry, and/or channels of the data path 610. The RE signal 614 may be propagated through RE regions, stages, circuitry, and/or channels of the data path 610, and the BRE signal 664 may be propagated through separate BRE regions, stages, circuitry, and/or channels of the data path 610. Alternatively, or in addition, the RE signal 614 and the BRE signal 664 may propagate through one or more of the same regions, stages, circuitry, and/or channels of the data path 610.

The input stage 620N may include duty adjust circuitry 108, which may be configured to adjust and/or trim the signals 114 being propagated within the data path 610, which may comprise adjusting and/or trimming the RE signal 614 and adjusting and/or trimming the BRE signal 664. The duty cycle adjust circuitry 108 may be configured to implement duty cycle adjustment and/or trim operations in accordance with the duty cycle correction data 166. The duty cycle correction data 166 may define, inter alia, an amount of duty cycle adjust and/or trim to apply to the signal 114, including the RE signal 614 and BRE signal 664 to compensate for the duty cycle error measured within the path 610 (e.g., per the DCDC 164 determined for the path 610).

The data path 610 may further comprise a repeater stage 620B, which may comprise one more repeater circuits 642A-N. The repeater circuits 642A-N may be configured to process and/or manipulate the signal 114 (including the RE signal 614 and/or BRE signal 664), which may comprise buffering the signal 114, delaying the signal 114, repeating the signal 114, and/or otherwise processing and/or manipulating the signal 114.

The output stage 620N of the data path 610 may comprise data output circuitry 672 configured to generate data output signals 118 by use of the signal 114 communicated to the output stage 620N through the data path 610 (e.g., signal 114N). The data output signals 118 may include DQS signals 618A and BDQS signals 618B. The DQS signals 618A may comprise DQS data signals and DQS strobe signals. The BDQS signals 618B may comprise BDQS data signals and BDQS strobe signals. The data output circuitry 672 may comprise a DQS generator 673A and a BDQS generator 673B. The DQS generator 673A may be configured to produce the DQS signals 618A, and the BDQS generator 673B may be configured to produce the BDQS signals 618B. Generating the DQS signals 618A may comprise generating DQS data signals and DQS strobe signals. The DQS data signals may be generated by combining the RE signal 614 received at the output stage 620N (e.g., RE signal 614N) with output data. Accordingly, the DQS data signal and the DQS strobe signal may comprise and/or correspond to the RE signal 614N (e.g., the DQS data signal and DQS strobe signal may comprise a logical combination of the RE signal 614N and the output data). The RE signal 614N used to produce the DQS signals 618A may be reconstructed by logically combining the DQS data signal with the DQS strobe signal (in an XOR logical combination). The BDQS signals 618B may be generated by combining the BRE signal 664 received at the output stage 620N (e.g., BRE signal 664N) with output data. Accordingly, the BDQS data signal and the BDQS strobe signal may comprise and/or correspond to the BRE signal 664N (e.g., the BDQS data signal and BDQS strobe signal may comprise a logical combination of the BRE signal 664N and the output data). The BRE signal 664N used to produce the BDQS signals 618B may be reconstructed by logically combining the BDQS data signal with the BQDS strobe signal (in an XOR logical combination).

The output stage 620N may comprise and/or be communicatively coupled to memory circuitry. The memory circuitry may be configured to acquire the output data used to generate the DQS signals 618A and/or BDQS signals 618B, as disclosed herein. The memory circuitry may comprise memory address circuitry, memory read circuitry, memory write circuitry, sense circuitry, memory interface circuitry, a memory bus, a memory interconnect, memory buffer circuitry (first-in-first-out buffer circuitry), and/or the like (not shown in FIGS. 1A, 1B, 4A, 6A, 7, and 8A to avoid obscuring the details of the illustrated embodiments). As disclosed herein, during duty cycle measurement and/or analysis operations, the memory circuitry may be configured to provide test data for use in producing the data output signals 118 (e.g., an "FF" data pattern for use in generating the DQS signals 618A and/or BDQS signals 618B).

The output stage 620N may further comprise a DQS data output buffer 674A and corresponding DQS output circuitry 676A, and a BDQS data output buffer 674B and corresponding BDQS output circuitry 676B. The DQS data output buffer 674A may be configured to buffer the DQS signals 618A generated by the data output circuitry 672. The BDQS data output buffer 674B may be configured to buffer the BDQS signals 618B generated by the data output circuitry 672. The DQS output circuitry 676A may be configured to output the DQS signals 618B buffered within the DQS data output buffer 674A, and the BDQS output circuitry 676B may be configured to output the BDQS output signals 618B buffered within the BDQS data output buffer 674B. The DQS output circuitry 676A and/or BDQS output circuitry 676B may comprise respective ODT circuitry, input/output circuitry, input/output pads, input/output pins, driver circuitry, buffer control circuitry, output control circuitry, and/or the like.

In the FIG. 6A embodiment, the circuit 100 may further comprise a duty cycle measurement circuit 130, which may comprise and/or be communicatively coupled to interface circuitry 643. The interface circuitry 643 may comprise means for communicatively coupling the circuit 100 to the diagnostic device 160, as disclosed herein (e.g., means for communicating command signals 161 (and/or other information) to the circuit 100 from the diagnostic device 160 to the circuit 100 and/or means for communicating duty cycle measurements 141, differential duty cycle measurements 151 (and/or other information) from the circuit 100 to the diagnostic device 160). The interface circuitry 643 may include, but is not limited to: ODT circuitry, input/output circuitry, input/output pads, input/output pins, probes, a dedicated testing and/or diagnostic interface, a configuration interface, and/or the like. In some embodiments, the interface circuitry 643 may comprise and/or be communicatively coupled to a test controller 440, as illustrated in FIG. 4A.

The interface circuitry 643 may be configured to receive, generate, and/or propagate internal signals 445 within the circuit 100 (e.g., within the duty cycle circuit 130, data path 610, and/or the like). The internal signals 445 may configure the circuit 100 to perform duty cycle measurement, analysis, and/or compensation operations, as disclosed herein. The interface circuitry 643 may be configured to perform duty cycle measurement operations in response to command signals 161 from the diagnostic device 160 (and/or as part of built-in self-test and/or other diagnosis operations). Performing a duty cycle measurement operation may comprise acquiring duty cycle measurements 141 and/or differential duty cycle measurements 151 (e.g., measurements 141A and 141N corresponding to different respective path locations 612A and 612N) while test stimulus 605 is provided thereto. The test stimulus 605 may comprise a time-variant, oscillating test input signal 105 produced by signal generator 131, a probe signal 607, test output data (such as an "FF" data pattern for use within the output stage 620N and/or produced by memory circuitry, as disclosed above), and/or the like.

In the FIG. 6A embodiment, the RE ODT circuitry 622A may be coupled to a probe 633, and the BRE ODT circuitry 622B may comprise and/or be coupled to the signal generator 131. The coupling between the RE ODT circuitry 622A and the probe 633 may prevent the RE ODT circuitry 622A from receiving and/or propagating the test input signal 105 due to, inter alia, capacitance of the probe 633, capacitive grounding, limitations of the probe 633, and/or the like. The BRE ODT circuitry 622B may not be coupled to a probe and/or may be capable of being decoupled and/or isolated from such circuitry during duty cycle measurement and/or analysis operations. As such, the test stimulus 605 for duty cycle measurement and/or analysis operations may comprise: a) a probe signal 607 to be applied to the RE ODT circuitry 622A (from probe 633), b) a test input signal 105 to be applied to the BRE ODT circuitry 622B (and generated by the signal generator 131, as disclosed herein), and c) test output data for use in generating BDQS signals 618B at the data output circuitry 672 of the output stage 620N of the data path. The probe signal 607 may comprise a substantially constant voltage signal at about ½ VCCQ (one-half the input/output voltage VCCQ).

Performing a duty cycle measurement and/or analysis operation on the circuit 100 may comprise, inter alia: a) providing test stimulus 605 to the data path 610, b) configuring the first measurement circuit 630A to obtain first duty cycle measurements 141A corresponding to the first path location 612A and/or propagation distance 613A (while the test stimulus 605 is being applied), and c) configuring the first measurement circuit 630A to obtain second duty cycle measurements 141N corresponding to the second path location 612N and/or propagation distance 613N (while the test stimulus is being applied). The circuit 100 may be so configured by use of internal signals 445, as disclosed herein.

Applying the test stimulus 605 may comprise: a) configuring the RE input circuitry 622A to receive the probe signal 607 and to provide the probe signal 607 to the input receiver circuitry 624 for propagation within the data path 610 as RE signal 614, b) configuring the signal generator 131 to produce the test input signal 105, c) configuring the BRE input circuitry 622B to receive the test input signal 105 and to provide the test input signal 105 to the input receiver circuitry 624 for propagation within the data path 610 as BRE signal 664, and/or d) configuring the output stage 620N and/or memory circuitry to generate DQS signals 618A and/or BDQS signals 618B by use of a test data pattern (e.g., "FF" data pattern).

As illustrated above, applying the test stimulus 605 may comprise coupling the RE signal 614 to the probe signal 607, which may comprise a substantially constant voltage signal (e.g., ½ VCCQ). By contrast, the BRE signal 664 may comprise and/or correspond to the test input signal 105, which may comprise an oscillating timing signal. As such, the duty cycle measurement circuit 130 may be configured to obtain differential duty cycle measurements 151 corresponding to propagation of the BRE signal 664 along the data path 610 (as opposed to propagation of the RE signal 614). The duty cycle circuit 130 may acquire first duty cycle measurements 141A as disclosed wherein, which may comprise connecting a first measurement circuit 630A to location 612A within the data path 610, and obtaining measurement(s) of the voltage potential $V_{DU}$ 341 on the output node 349 of the first measurement circuit 630A, as disclosed herein. The path location 612A may comprise BRE signal 664A. The signal 664A may correspond to propagation of the BRE signal 664 to location 612A (and/or propagation distance 613A). The location 612A may be within the input stage 620A of the data path 610, such that the BRE signal 612A is substantially equivalent to the test input signal 105. Accordingly, the duty cycle ($D_A$) and/or duty cycle distortion ($\Delta T_A$) of the BRE signal 664A at location 612A may comprise the input duty cycle ($D_{IN}$) and/or input duty cycle distortion ($\Delta T_{IN}$) for the duty cycle measurement and/or analysis operation. The duty cycle circuit 130 may be further configured to acquire second duty cycle measurements 141N, as disclosed herein, which may comprise connecting a second measurement circuit 630N to location 612N within the data path 610 (at propagation distance 613N), and obtaining measurement(s) of the voltage potential $V_{DU}$ 341 on the output node 349 of the second measurement circuit 630N, as disclosed herein. The location 612N may correspond to propagation of the BRE signal 664 along the data path 610 to location 612N (and/or propagation distance 613N). The location 612N may be within the output stage 620N of the data path 610. Accordingly, the duty cycle ($D_N$) and/or duty cycle distortion ($\Delta T_N$) of the BRE signal 664N at location 612A may comprise the output duty cycle ($D_{OUT}$) and/or output duty cycle distortion ($\Delta T_{OUT}$) for the duty cycle measurement and/or analysis operation. The duty cycle measurements 141A and 141N may comprise differential duty cycle measurements 151, which may be used to determine a measure of the DCDC 164 of the data path 610, and/or determine duty cycle correction data 166 to compensate for the measured DCDC 164, as disclosed herein.

In some embodiments, the first measurement circuit 630A and the second measurement circuit 630N comprise separate, independent DVC circuits 330 (e.g., the DVC circuits 330 illustrated in FIG. 5B). In the FIG. 6A embodiment, the duty cycle measurement circuit 130 may comprise a shared capacitive element used by both the first measurement circuit 630A and the second measurement circuit 630N. The shared capacitive element may comprise node 662, having capacitance 660. The node 662 may be coupled to a generator unit 663, which may be selectively configured to produce a pseudo VCCQ voltage potential on the node 662. As disclosed in further detail herein, the node 662 may comprise a shared capacitive element for use by both of the first measurement circuit 630A and second measurement circuit 630N.

Figure 6B:
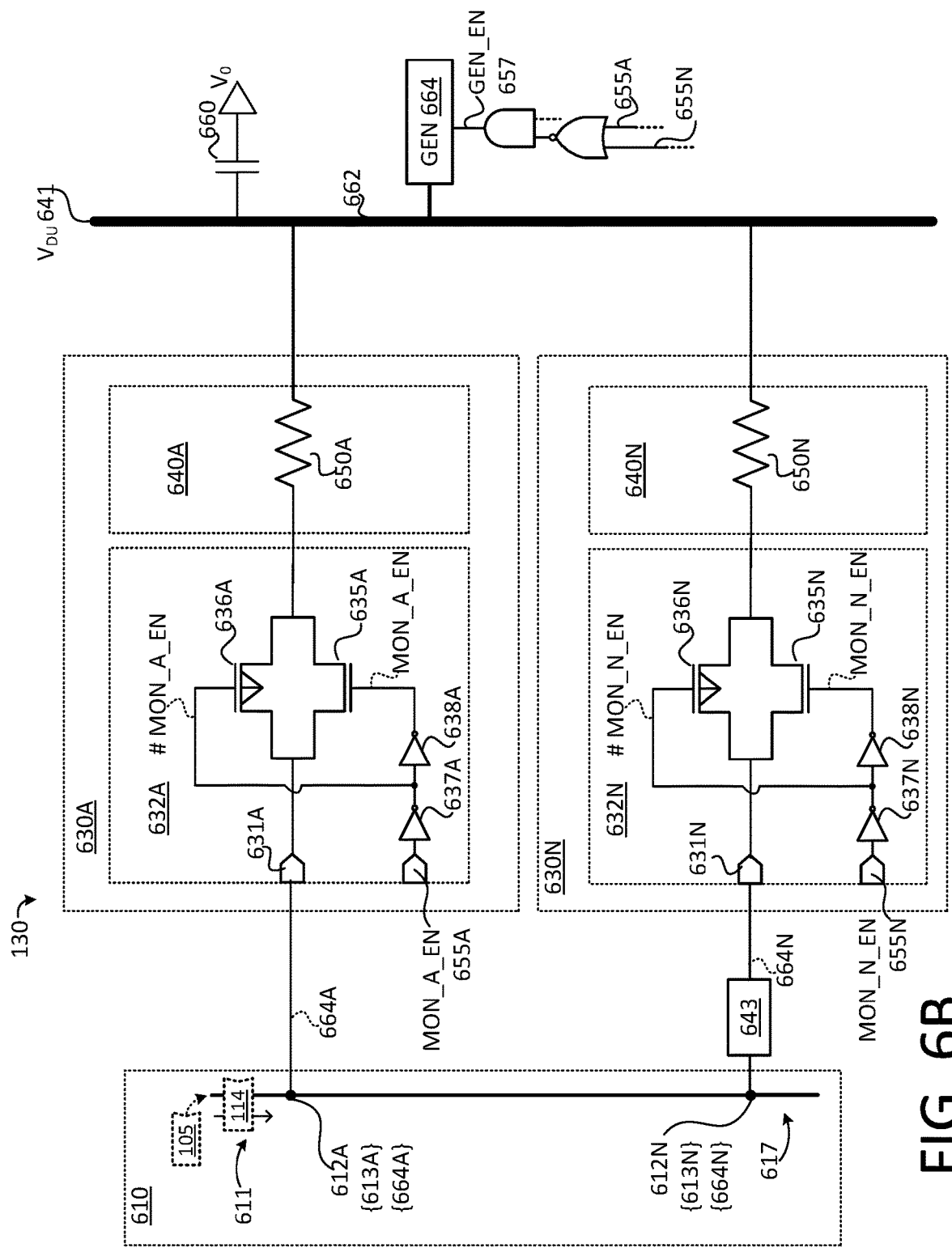
FIG. 6B is a schematic block diagram of an embodiment of duty cycle measurement circuitry configured to acquire differential duty cycle measurements.

FIG. 6B is a schematic block diagram of one embodiment of a duty cycle measurement circuit 130 configured to acquire differential duty cycle measurements 151. The duty cycle measurement circuit 130 of FIG. 6B may comprise a first measurement circuit 630A and a second measurement circuit 630N. The first measurement circuit 630A and second measurement circuit 630N may be controlled by internal signals 445, including a MON_A_EN signal 655A and MON_N_EN signal 655N. the MON_A_EN signal 655A may configure the first measurement circuit 630A to obtain first duty cycle measurements 141A corresponding to path location 612A, and the MON_N_EN signal 655N may configure the second measurement circuit 630N to obtain second duty cycle measurements 141N corresponding to path location 612N.

The input node 631A of the first measurement circuit 630A may be coupled to accumulator circuitry 640A through control circuitry 632A, comprising transistors 635A and 636A. The gate of transistor 635A may be coupled to the MON_A_EN signal 655A (through inverters 637A and 638A), and the gate of transistor 636A may be coupled to a #MON_A_EN signal produced by inverter 637A. Accordingly, when the MON_A_EN signal 655A is asserted, the input node 631A may be connected to location 612A within the data path 610. When connected, the BRE signal 664A at location 612A may be coupled to the accumulator circuitry 640A, which may comprise coupling the BRE signal 664A to node 662 (and capacitance 660) through resistor 650A. When connected to location 612A to receive BRE signal 664A, the voltage potential $V_{DU}$ 641 on node 662 may correspond to the duty cycle ($D_A$) of the BRE signal 664A at path location 612A. Accordingly, duty cycle measurements 141A corresponding to the BRE signal 664A at path location 612A may comprise measurement(s) of the voltage potential $V_{DU}$ 641 while the node 662 receives BRE signal 664A (from location 612A) through resistor 650A, as disclosed herein.

The second measurement circuit 630N may be selectively connected to path location 612N by control circuitry 632N in accordance with the MON_N_EN signal 655N. The MON_N_EN signal 655N and an inverse #MON_N_EN signal may flow to the gate terminals of transistors 635N and 636N of the control circuitry 632N through inverters 637N and 638N. When the MON_E_EN signal 655N is asserted, the input node 631N of the second measurement circuit 630N may be connected to location 612N of the data path 610. In some embodiments, the input node 631N may be connected to location 612N through circuitry 643. The circuitry 643 may comprise a dummy gate and/or the like. In some embodiments, the circuitry 643 may be configured to disconnect and/or isolate the second measurement circuit 630N from the data path 610 when duty cycle measurement operations are not being performed (e.g., when MON_N_EN 655N is deasserted).

When the MON_N_EN signal 655N is asserted, the accumulator circuitry 640N of the second measurement circuit may receive the BRE signal 664N at path location 612N. The BRE signal 664N may be coupled to node 662 (and capacitance 660) through resistor 650N. When connected to receive the BRE signal 664N at path location 612N, the voltage potential $V_{DU}$ 641 on node 662 may correspond to the duty cycle ($D_N$) of the BRE signal 664N. Accordingly, the duty cycle measurements 141N may comprise measurement(s) of the voltage potential $V_{DU}$ 641 on node 662 while the accumulator circuitry 640N is connected to receive the BRE signal 664N at location 612N, as disclosed herein.

The accumulator circuitry 640A and 640N may have respective RC values. The RC values may correspond to the capacitance 660 of node 662 and the resistance of resistors 650A and 650N, respectively. The RC values of the accumulator circuitry 640A and 640N may be configured in accordance with the period of the BRE signal 664 and/or test input signal 105 (e.g., to be significantly larger than the period thereof). The period of the BRE signal 664 may be about 1.875 ns. The capacitance 660 of node 662 may be about 11.3 pF, and the resistance of each resistor 650A and 650N may be about 134.4 k ohms. As disclosed above, the use of high resistance values in resistors 650A and 650N may enable the size of transistors 635A, 636A, 635N, and/or 636N to be reduced (e.g., to about 5 to 10 um). The use of the capacitance 660 of existing node 662 may enable the size and/or overhead of the duty cycle measurement circuit 130 to be further reduced. The duty cycle measurement circuit 130 of FIG. 6B may have a layout size of about 25 by 10 um. Although particular embodiments of duty cycle measurement circuitry are disclosed herein, including particular resistance and capacitance values, the disclosure is not limited in this regard and could be adapted to include any suitable duty cycle measurement circuitry, including accumulator circuitry having any suitable RC values corresponding to any suitable signal period.

As disclosed above, the diagnostic device 160 and/or interface circuitry 643 may be configured to produce internal signals 445 to configure the circuit 100 to perform duty cycle measurement and/or analysis operations. The internal signals 445 may include the MON_A_EN signal 655A and/or MON_N_EN signal 655N. The internal signals 445 may be controlled such that the signals 655A and 655N are not asserted concurrently. The signals 655A and 655N may be used to selectively disable the generator unit 663, such that the generator unit 663 is disabled from driving the node 662 (and/or is disconnected from node 662) when either the MON_A_EN signal 655A or MON_N_EN signal 655N is asserted (e.g., logic forming an enable signal of the generator unit 663, GEN_EN signal 657, may disable the generator unit 663 when either signal 655A or 655N is asserted).

Referring back to FIG. 6A, implementing a duty cycle measurement and/or analysis operation may comprise generating internal signals 445 to configure the circuit 100 to: a) apply test stimulus 605, and b) acquire differential duty cycle measurements 151, including first duty cycle measurements 141A and second duty cycle measurements 141N, by asserting the MON_A_EN signal 655A (and deasserting the MON_N_EN signal 655N) and/or asserting the MON_N_EN signal 655N (and deasserting the MON_A_EN signal 655A). Acquiring the differential duty cycle measurements 151 may comprise obtaining a plurality of duty cycle measurements 141A and 141N corresponding to each location 612A and 612N, processing the duty cycle measurements 141A and 141N, and so on, as disclosed herein. The differential duty cycle measurements 141 may be communicated to the diagnostic device 160, as disclosed herein. In some embodiments, the diagnostic device 160 may be communicatively coupled to node 662 (by use of interface circuitry 643, such as a probe, input/output pad, and/or the like). Accordingly, the diagnostic device 160 may be configured to acquire duty cycle measurements 141A and 141N directly from the circuit 100. The diagnostic device 160 may acquire first duty cycle measurements 141A by, inter alia, a) generating command signals 161 configured to apply the test stimulus 605 to the data path 610 and assert the MON_A_EN signal 655A, and b) obtaining voltage potential measurement(s) at node 662 (via interface circuitry 643). The diagnostic device may acquire second duty cycle measurements 141N by, inter alia, a) generating command signals 161 configured to apply the test stimulus 605 to the data path 610 and assert the MON_N_EN signal 655N, and b) obtaining voltage potential measurement(s) at node 662 (via interface circuitry 643).

The diagnostic device 160 may use the duty cycle measurements 141 (e.g., differential duty cycle measurements 151 including measurements 141A and 141N) to determine a measure of the DCDC 164 within the data path 610 and/or produce duty cycle correction data 166 configured to compensate for the measured DCDC 164 of the data path 610. The duty cycle correction data 166 may be recorded within the circuit 100, as disclosed herein. The duty cycle adjust circuitry 108 may be configured to adjust and/or trim the duty cycle of RE signals 614 and/or BRE signals 664 in accordance with the duty cycle correction data 166, as disclosed herein.

Figure 7:
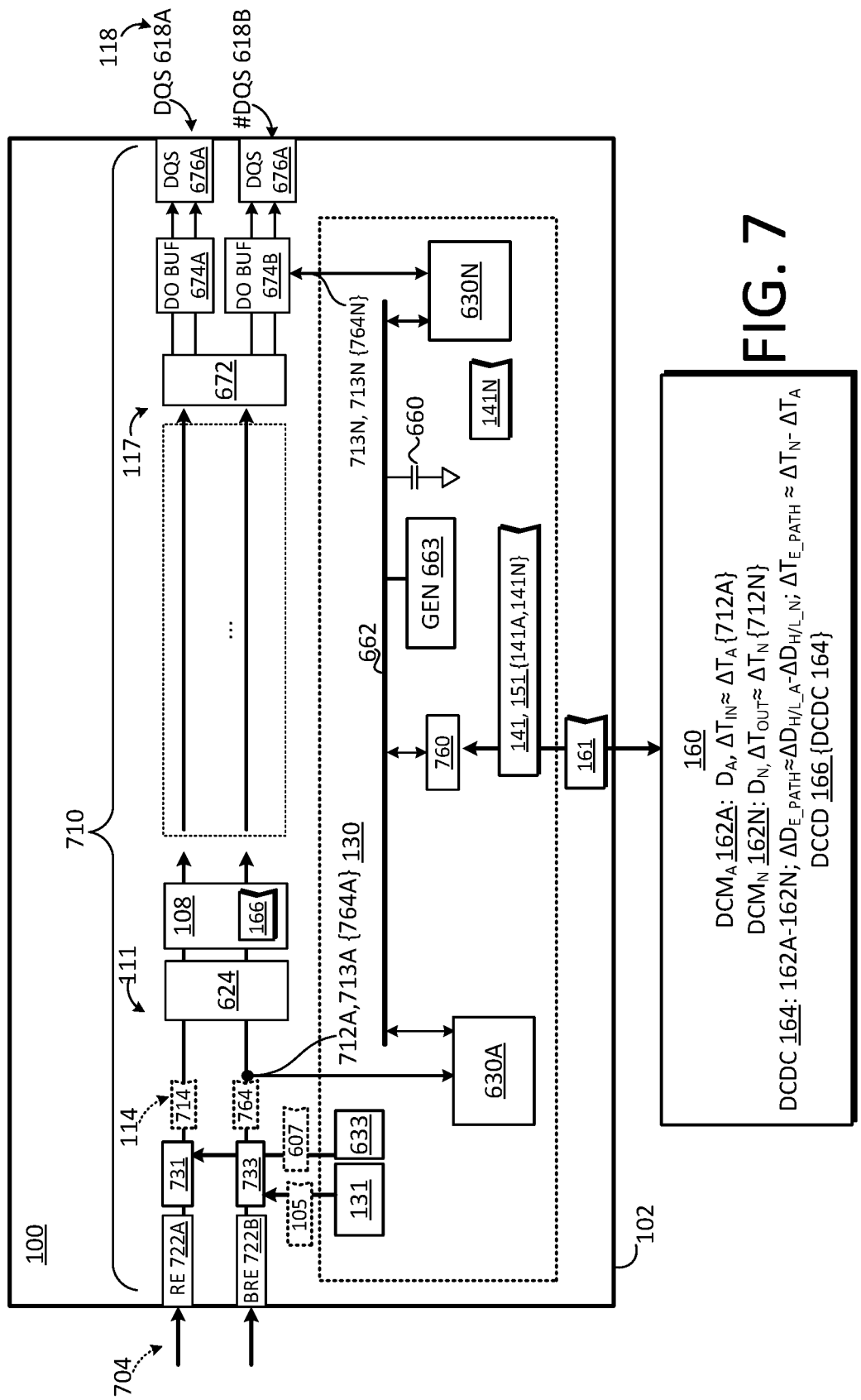
FIG. 7 is a schematic block diagram of another embodiment of a data path comprising duty cycle measurement circuitry.

FIG. 7 is a schematic block diagram of another embodiment of a circuit 100 comprising a data path 710 and a duty cycle measurement circuit 130. Circuitry comprising the data path 710 and/or duty cycle measurement circuit 130 may be embodied on a semiconductor 102, as disclosed herein. The data path 710 may be configured to propagate signals 114 from an input region 111 towards an output region 117. The signals 114 may correspond to one or more of a) external input signals 704, and/or b) test stimulus 605, which may comprise a test input signal 105 produced by signal generator 131 and/or a probe signal 607, as disclosed herein. The data output path 710 may be further configured to receive external inputs 704, including an external RE input and external BRE input. The data output path 710 may comprise RE ODT circuitry 722A configured to receive external RE inputs, and BRE ODT circuitry 722B configured to receive external BRE inputs.

The data path 710 may further comprise a transfer switch 731 and level shifter 733. The transfer switch 731 may be configured to couple one of the RE ODT circuitry 722A and probe 633 to the data path 717, such that the RE signals 714 propagated within the data path 710 correspond to one of a) external RE input received at the RE circuitry 722A and b) the probe signal 607 received through the probe 633 (e.g., a reference input/output voltage signal, $V_{REF}$). The level switch 733 may be configured to couple one of the BRE ODT circuitry 722B and signal generator 131 to the data path 710, such that the BRE signals 764 propagated within the data path 710 correspond to one of a) external BRE input received at the BRE ODT circuitry 722B and b) the test input signal 105 produced by the signal generator 131. The data 710 may further comprise data output circuitry 672, which may be configured to generate DQS signals 618A and/or BDQS signals 618B by use of the RE signal 714 and/or BRE signal 764 propagating along the data path 710, as disclosed herein.

The duty cycle measurement circuit 130 may be configured to perform duty cycle measurement and/or analysis operations on the circuit 100, as disclosed herein. Performing a duty cycle measurement and/or analysis operation may comprise: a) configuring the data path 710 to receive test input signal(s), such as the test input signal 105 produced by the signal generator 131 and/or reference input/output voltage of the probe 633, and b) acquiring differential duty cycle measurements 151 including duty cycle measurements 141 corresponding to two different locations and/or propagation distances along the data output path 710. In the FIG. 7 embodiment, the duty cycle measurement circuit 130 may be configured to acquire duty cycle measurements 141A, which may correspond to a duty cycle ($D_A$) and/or duty cycle distortion ($\Delta T_A$) of the BRE signal 764A at path location 712A (and/or at propagation offset 713A along the data path 710), as disclosed herein. The duty cycle measurement circuit 130 may be further configured to obtain duty cycle measurements 141N, which may correspond to a duty cycle ($D_N$) and/or duty cycle distortion ($\Delta T_N$) of the BRE signal 764N at path location 712N (and/or at propagation offset 713N along the data path 710), as disclosed herein. The second location 712N may correspond to the BDQS data output buffer 674B, which may be at a further propagation distance 713N along the data path 710 than propagation distance 613N of FIG. 6A. The duty cycle measurement circuit 130 may provide the differential duty cycle measurements 151 (including duty cycle measurements 141A and 141N) to the diagnostic device 160, which may use the differential duty cycle measurements 151 to determine a DCDC 164 for the data path 710 and/or derive corresponding duty cycle correction data 166 for the data path 710, as disclosed herein. The diagnostic device 160 may be further configured to record the duty cycle correction data 166 within the circuit 100. The duty cycle adjust circuitry 108 of the data path 710 may use the duty cycle correction data 166 to compensate for the measured DCDC 164, as disclosed herein (e.g., may adjust and/or trim the duty cycle of signals 114 propagating within the data path 710 during operation of the circuit 100, including RE signals 714 and BRE signals 764).

In the FIG. 7 embodiment, the diagnostic device 160 may configure the duty cycle measurement circuit 130 and/or data path 710 to implement duty cycle measurement operations. The diagnostic device 160 may provide command signals 161 to the circuit 100 via one or more communication buses, input/output pads, diagnostic input/output pads, and/or the like, as disclosed herein. The command signals 161 may configure the data path 710 to receive test input signals corresponding to a duty cycle measurement operation, which may comprise: providing a reference voltage signal on probe 633; configuring the transfer switch 731 to propagate the probe signal 607 within the data path 710 (as RE signal 714) rather than external RE input signals received at the RE ODT circuitry 722A; configuring the signal generator 131 to produce test input signal 105; configuring the level shifter 733 to propagate the test input signal 105 within the data path 710 (as BRE signal 764) rather than external BRE input(s) received at the BRE ODT circuitry 722B; and configuring memory circuitry to provide an "FF" data pattern for output as DQS signals 618A and/or BDQS signals 618B, respectively. The command signals 161 may further configure the duty cycle circuit 130 to acquire differential duty cycle measurements 151, including duty cycle measurements 141A and duty cycle measurements 141N. Command signals 161 to acquire first duty cycle measurements 141A may comprise command signals 161 to connect the first measurement circuit 630A to location 712A within the data path 710 and node 662 (e.g., by asserting the MON_A_EN signal 655A and/or deasserting the MON_N_EN signal 655N). Command signals 161 to acquire second duty cycle measurements 141N may comprise command signals 161 to connect the second measurement circuit 630N to location 712N within the data path 710 and node 662 (e.g., by asserting the MON_N_EN signal 655N and/or deasserting the MON_A_EN signal 655A). The command signals 161 may further comprise requests to communicate the duty cycle measurements 141 (e.g., differential duty cycle measurements 151, including measurements 141A and 141N) to the diagnostic device 160 through, inter alia, the input/output circuitry 760. The input/output circuitry 760 may comprise a probe, an input/output pad, an input/output pin, a dedicated testing and/or diagnostic interface, and/or the like. In the FIG. 7 embodiment, the input/output circuitry 760 may be communicatively coupled to node 662 (to obtain voltage potential measurements $V_{DU}$ therefrom). The diagnostic device 160 may, therefore, obtain the differential duty cycle measurements 151 directly by reading voltage potential measurements from the input/output circuitry 733 during the duty cycle measurement operations disclosed herein (e.g., while providing test input(s) to the data path 710 and/or connecting one of the first measurement circuit 630A and second measurement circuit 630N to the node 662 and a respective location 712A or 712N within the data path 710).

FIG. 8A is a schematic block diagram of another embodiment of a circuit 100 comprising a data path 810 and a duty cycle measurement circuit 830. In the FIG. 8A embodiment, the data path 810 may receive input signals 704 and propagate corresponding signals 114 within the data path 801 (to generate data output signals 118, which may comprise data strobe signals, including DQS data output signals 618A and BDQS data output signals 618B). The RE ODT circuitry 622A may be configured to receive external RE input signals and/or a probe signal 607 (e.g., voltage reference signal ($V_{REF}$) via probe 633). The BRE ODT circuitry 822B may be configured to receive external BRE input signals. The BRE ODT circuitry 822B may be configured to generate a test input signal 105 (e.g., may comprise an oscillator and/or control logic as illustrated in FIG. 4B).

The RE ODT circuitry 622A may be configured to output one of: a) external RE input signals received thereby, and b) the probe signal 607 for propagation as RE signal 814 along the data path 810. The BRE ODT circuitry 822B may be configured to output one of: a) external BRE input signal(s) received thereby, and b) a test input signal 105 produced therein. The input receiver 624 may be configured to propagate signals 114 within the data path 810 (from the input region 111 towards the output region 117 thereof), which may comprise propagating an RE signal 814 corresponding to one of an a) external RE input signal, and b) the probe signal 607, and an BRE signal 864 corresponding to one of an a) external BRE input signal, and b) test input signal 105.

The duty cycle measurement circuit 830 may be configured to be selectively coupled to one or more locations, positions, and/or propagation distances along the data path 810. In the FIG. 8A embodiment, the duty cycle measurement circuit 830 is configured to be connected to one of path location 812A and path location 812N. The path locations 812A and 812N may correspond to propagation of the BRE signal 864 within the data path 810 (by propagation distances 813A and 813N, respectively). Path location 812A may comprise BRE signal 864A, which may correspond to propagation of the BRE signal 864 to location 812A along the data path 810 (and/or propagation distance 813A through the data path 810). Path location 812N may comprise BRE signal 864N, which may correspond to propagation of the BRE signal 864 to location 812N along the data path 810 (and/or propagation distance 813N through the data path 810). The location 812N may correspond, be within, and/or be positioned within a proximity threshold of the output region 117 of the data path 810. The proximity threshold may correspond to one or more of a propagation distance, processing operation(s) performed within the data path 810, manipulation operations(s) performed within the data path 810, and/or the like. The proximity threshold corresponding to location 812A may be selected such that a duty cycle ($D_A$) of the signal 864A at location 812A comprises the duty cycle ($D_{IN}$) for the duty cycle measurement operation. The proximity threshold corresponding to location 812N may be selected such that a duty cycle ($D_N$) of the signal 864N at location 812N is substantially the same as the duty cycle ($D_{OUT}$) used to produce the data output signals 118 (e.g., clock signals used to produce BQDS 618B).

Figure 8B:
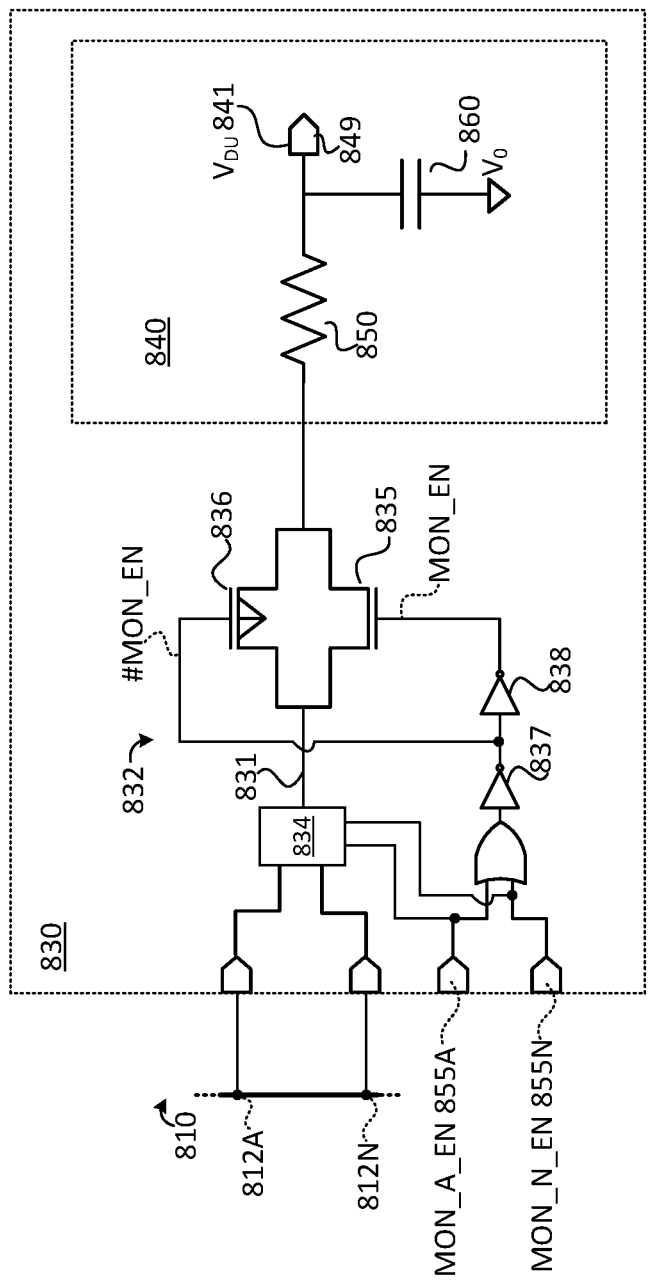
FIG. 8B is a schematic block diagram of another embodiment of a duty cycle measurement circuitry configured to acquire differential duty cycle measurements.

The circuit 100 of the FIG. 8A embodiment may comprise a duty cycle measurement circuit 830 configured to acquire differential duty cycle measurements 151, including duty cycle measurements 141 corresponding to different respective path locations 812A and 812N and/or propagation distances 813A and 813N. FIG. 8B is a schematic block diagram of one embodiment of a duty cycle measurement circuit 830. The duty cycle measurement circuit 830 may comprise DVC circuitry, including control circuitry 832 and accumulator circuitry 840. The control circuitry 832 may receive a MON_A_EN signal 855A (to enable duty cycle monitoring at location 812A) and MON_N_EN signal 855N (to enable duty cycle monitoring at location 812N). The input circuit 832 may comprise select circuitry 834, which may be configured to connect the input node 831 of the DVC circuit 830 to one of location 812A and location 812N (based on signals 855A and 855N). When MON_A_EN signal 855A is asserted, the select circuitry 834 may connect the input node 831 to location 812A, and when the MON_N_EN signal 855N is asserted, the select circuitry 834 may connect the input node 831 to location 812N. A logical OR combination of the signals 855A and 855N may comprise a MON_EN signal, which may be asserted when either MON_A_EN signal 855A or MON_N_EN signals 855N is asserted. The MON_EN signal may be connected to the gate of NMOS transistor 835 (through inverters 837 and 838) and an inverse, #MON_EN, may be connected to the gate of PMOS transistor 836. When the MON_A_EN signal 855A is asserted, the input node 831 is connected to location 812A, such that the accumulator circuitry 840 receives BRE signal 864A and the voltage potential $V_{DU}$ 841 on the output node 849 of the DVC circuit 830 corresponds to the duty cycle ($D_A$) of the BRE signal 864A (where $D_A \approx D_{IN}$). When, the MON_N_EN signal 855N is asserted, the input node 831 is connected to location 812N, such that the accumulator circuitry 840 receives the BRE signal 864N and the voltage potential $V_{DU}$ 841 on the output node 849 comprises a measure of the duty cycle ($D_N$) of the BRE signal 864N (where $D_N \approx D_{OUT}$). The output node 849 may be communicatively coupled to input/output circuitry 760, which may enable the diagnostic device 160 to obtain measurements of the voltage potential measurements $V_{DU}$ 841 on the output node 849, as disclosed herein.

The accumulator circuitry 840 may have an RC value, which may correspond to the resistance of resistor 850 and capacitance of capacitor 860. The accumulator circuitry 840 may be configured such that the RC value thereof is substantially larger than the period of the BRE signals 864A and/or 864N (e.g., about 1.875 ns). In one embodiment, the capacitance of capacitor 860 is 11.3 pF and the resistance of resistor 850 is 134.4 k ohms. The DVC circuit 830 could be adapted to have any suitable RC value for use with any signal period(s). The use of a high resistance value for resistor 850 may enable the size of transistors 835 and 836 to be reduced, which may reduce the size and/or overhead of the DVC circuit 830. The size and/or overhead of the DVC circuit 830 may be further reduced by using existing capacitive elements of the circuit 100, such as node 662 having capacitance 660, as disclosed herein. In such embodiments, the layout size of the DVC circuit 830 may be about 25 by 10 um.

Referring back to FIG. 8A, the diagnostic device 160 may be configured to perform duty cycle measurement operations by use of the duty cycle circuit 830. Performing a duty cycle operation may comprise: a) configuring the circuit 100 to provide test input signals to the data path 810, as disclosed herein (e.g., by issuing command signals 161 to configure the RE ODT circuitry 622A to output the probe signal 733 for propagation as RE signal 814 and to configure the BRE ODT circuitry 822A to generate the test input signal 105 for propagation as the BRE signal 864 along the data pat 810); b) configuring the duty cycle measurement circuit 830 to obtain differential duty cycle measurements 151 comprising duty cycle measurements 141 corresponding respective path locations 812A and 812N, which may comprise command signals 161 (and/or internal signals 445) to assert one of the MON_A_EN signal 855A and MON_B_EN signal 855N, as disclosed herein. The diagnostic device 160 may be further configured to acquire the measurement(s) of the voltage potential $V_{DU}$ on the output node 839 of the duty cycle measurement circuit 830 by use of input/output circuitry 760, as disclosed herein. When the duty cycle measurement circuit 830 is connected to the data path 810 at location 812A, the duty cycle measurements 141A may correspond to the duty cycle distortion ($\Delta T_A$) resulting from propagation to location 812A along the data path 810, which may be substantially equivalent to an input duty cycle ($D_{IN}$) and/or input duty cycle distortion ($\Delta T_{IN}$). When the duty cycle measurement circuit 830 is connected to the data path 810 at location 812N, the duty cycle measurements 812N may correspond to the duty cycle distortion ($\Delta T_N$) resulting from propagation to location 812N along the data path 810, which may be substantially equivalent to the output duty cycle distortion ($D_{OUT}$) of the data path 810. Accordingly, the duty cycle distortion corresponding to signal propagation through the data path 810 may be determined by comparing and/or differencing the duty cycle measurements 141N-141A (and/or $\Delta T_{OUT}-\Delta T_{IN}$), which may correspond to a duty cycle change to signals during propagation through the data path 810 (e.g., the DCDC 164 for the data path 810). The diagnostic device 160 may, therefore, determine a measure of the DCDC 164 of the data path 810 and/or derive corresponding duty cycle correction data 166 for the data path 810, based on the duty cycle measurements 141A and 141N acquired by use of the duty cycle circuit 830. The diagnostic device 160 may be further configured to record the duty cycle correction data 166 on the circuit 100 for use by the duty cycle adjust circuitry 108 to compensate for the measured duty cycle error within the data path 810.

Figure 9:
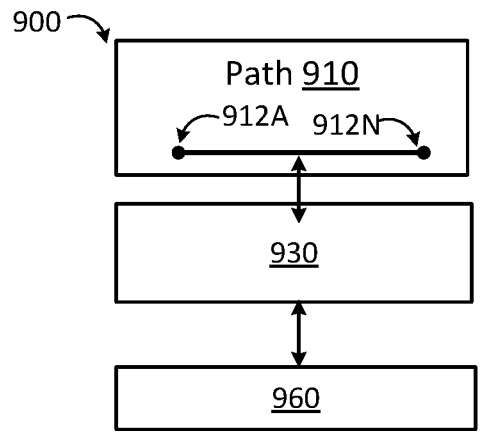
FIG. 9 is a schematic block diagram of one embodiment of a system for duty cycle measurement, analysis, and/or compensation.

FIG. 9 is a simplified block diagram of a system 900 for duty cycle measurement, analysis, and/or compensation. The system 900 may comprise means 930 for obtaining duty cycle measurements corresponding one or more path locations 112 and/or propagation offsets 113 within path 910. The means 930 may be configured to obtain duty cycle measurements corresponding to a first path location 912A and a second path location 912N. The first path location 912A may correspond to an input region 111 and the second location 912N may correspond to an output region 117. The means 130 may comprise duty cycle measurement circuitry as disclosed herein (e.g., a duty cycle measurement circuit 130, 630, and/or 830, duty cycle measurement circuitry, DVC circuitry, and/or the like). The measurement means 930 may comprise accumulator circuitry 340 and/or 540, which may comprise RC circuitry, as disclosed herein. The system 900 may further comprise means 960 for analyzing the duty cycle measurements acquired by means 930 to determine a measure of the DCDC 164 for the path 910, derive corresponding duty cycle correction data 166, configure duty cycle adjust circuitry 108 to compensate for the measured duty cycle errors (e.g., store the duty cycle correction data 166 on the circuit 100), and so on, as disclosed herein. The analysis means may comprise duty cycle measurement circuitry, test controller, the test interface, and/or diagnostic device 160, as disclosed herein.

Figure 10:
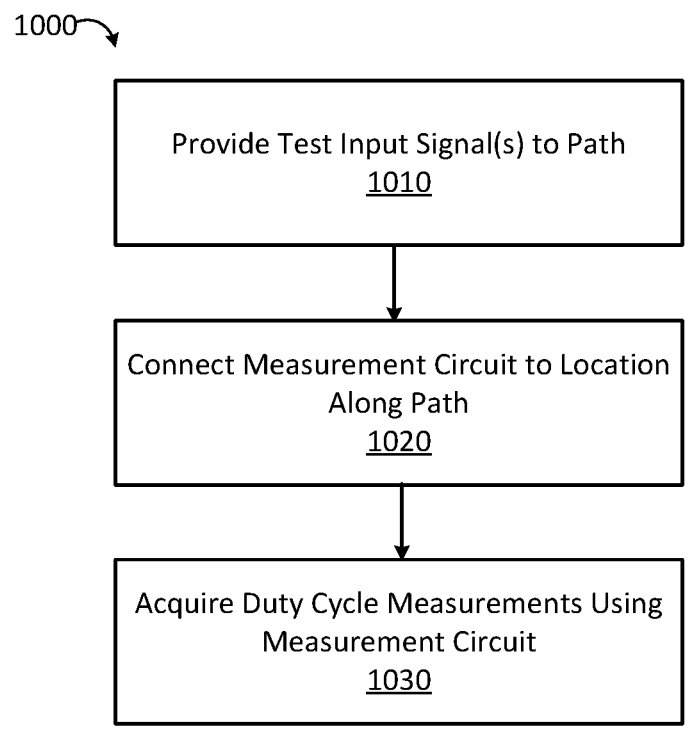
FIG. 10 is a flow diagram of one embodiment of a method for duty cycle measurement, analysis, and/or compensation.

FIG. 10 is a flow diagram of one embodiment of a method 1000 for duty cycle measurement, analysis, and/or compensation. Step 1010 may comprise providing test input signal(s) to a path 110. The path 110 may be embodied as a circuit 100 on a semiconductor chip 102, and may be comprised of interconnect circuitry 101, data output circuitry 401, and/or the like. The path 110 may comprise one or more of a data path 410, a timing path 510, a signal path, and/or the like. The test input signal(s) of step 1010 may comprise an oscillating signal to be propagated along the path 110 and/or used to generate data output signals 118. The test input signal(s) may include a test input signal 105 produced by a signal generator 131. The test input signal 105 may be propagated as a signal 114 and/or BRE signal 664 within path 110. The test input signal(s) may further comprise a probe signal 733 (e.g., a reference voltage signal) for propagation as RE signal 614 within path 110, test output data (e.g., an "FF" data pattern), and/or the like.

Step 1020 may comprise connecting a duty cycle measurement circuit to a location along the path 110. Step 1020 may comprise connecting a DVC circuit 330 to the path 110. Step 1020 may comprise connecting an input node 531 of the DVC circuit 330 to a selected location along the path 110, such that the signal 114 at the selected location is received at accumulator circuitry 340 of the DVC circuit 330. In some embodiments, the measurement circuit comprises input circuitry 332, including a switch configured to selectively connect the DVC circuit 330 to a designated path location 112. In such embodiments, step 1020 may comprise activating and/or closing the switch such that accumulator circuitry 340 of the DVC 330 is electrically coupled to the path 110 to receive a signal 314 thereon. In some embodiments, the measurement circuit comprises the DVC circuit 330 of FIG. 5A, and step 1020 comprises configuring the routing circuitry 534 thereof to connect the input node 531 to the selected location along the path 110. Alternatively, or in addition, the measurement circuit may comprise the DVC circuit 330 of FIG. 5B, having input node 531 connected to the selected location within the path 110 (e.g., location 512X) through control circuitry 532, and step 1020 may comprise asserting a MON_EN signal 435 to configure the control circuitry 532 to connect the location 512X to the accumulator circuitry 540 through transistors 535 and 546 (e.g., connect the selected location along path 110 to capacitor 560 through resistor 550). In some embodiments, the measurement circuit comprises the duty cycle measurement circuit 130 of FIG. 6B, and step 1020 comprises asserting one of: the MON_A_EN signal 655A to configure control circuitry 632A to connect input node 631A to a first path location (location 612A), and the MON_N_EN signal 655N to connect input node 631N to configure control circuitry 632N to connect input node 631N to a second path location (location 612N). In some embodiments, the measurement circuit comprises the duty cycle measurement circuit 830 of FIG. 8B, and step 1020 comprises asserting one of MON_A_EN 855A and MON_N_EN 855N to configure the select circuitry 834 and/or control circuitry 832 thereof to connect the input node 831 to one of a first path location (812A) and second path location (812N).

Step 1030 may comprise acquiring duty cycle measurements 141. The duty cycle measurements 141 correspond to the duty cycle of the signal 114 at the selected location. Acquiring the duty cycle measurements 141 may comprise obtaining measurements of a voltage potential $V_{DU}$ on a node of the measurement circuit while the test input signal(s) of step 1010 are provided to the path 110 and the measurement circuit remains connected to the selected location (per step 1020). Step 1030 may comprise receiving a signal 114 from the path 110, such that the signal 114 flows to accumulator circuitry 340, 540, 640A, 640N, and/or 840. The accumulator circuitry may comprise an RC characteristic corresponding to a resistance and/or capacitance thereof. The accumulator circuitry may be configured such that the RC characteristic is substantially larger than the period of the signal 114 (e.g., RC>>$t_P$ or $t_H$+$t_L$). The period of the signal 114 may be about 1.875 ns. The accumulator circuitry of the measurement circuit may be configured such that the RC characteristic thereof is greater than 1.875 ns. The capacitance of the accumulator circuitry may be about 11.3 pF and the resistance may be about 13.4 k ohms, which may correspond to an RC characteristic of about $1.518 \times 10^{-6}$. The disclosure is not limited in this regard, however, and could be configured to use measurement circuitry having RC characteristics adapted for use with signals 114 of any suitable period.

Step 1030 may further comprise disconnecting measurement circuitry from the path 110 in response to acquiring the duty cycle measurements 141. Step 1030 may comprise one or more of: disconnecting and/or deactivating a switch connecting the DVC circuit 330 to the path 110, configuring routing circuitry 534 to disconnect the DVC circuit 330 of FIG. 5A from the path 110, deasserting the MON_EN signal 435 to configure control circuitry 532 to disconnect the input node 531 from the path 110, deasserting one or more of the MON_A_EN signal 655A and the MON_N_EN signal 655N to disconnect measurement circuits 632A and/or 632N from the path 110, deasserting one or more of the MON_A_EN signal 855A and MON_B_EN signal 855N to configure the control circuitry 832 to disconnect the measurement 830 from the path 110, and/or the like.

The duty cycle measurements of step 1030 may comprise measurements of a voltage potential $V_{DU}$ on a node of the measurement circuit (e.g., $V_{DU}$ 341 on output node 349, $V_{DU}$ 641 on node 662, $V_{DU}$ 841 on output node 849, and/or the like). Acquiring the duty cycle measurements 141 may comprise obtaining a plurality of measurements of the voltage potential $V_{DU}$ (e.g., N measurements) and/or performing error mitigation processing on the N measurements, which may include, but are not limited to: determining an average, mean, and/or median voltage potential of the N measurements; determining a variance and/or deviation of the N measurements; rejecting outlier measurements of the N measurements; and/or the like.

Step 1030 may comprise communicating the duty cycle measurements 141 by, inter alia, recording the duty cycle measurements in a memory, transmitting the duty cycle measurements on a bus and/or interconnect, outputting the duty cycle measurements via an input/output pad and/or probe, connecting the output node 349, 662, and/or 849 to a probe (e.g., probe 760), and/or the like. The duty cycle measurements 141 may be used to determine a DCDC 164 for the path 110 and/or derive corresponding duty cycle correction data 166 for the path 110 to compensate to the determined DCDC 164, as disclosed herein.

Figure 11:
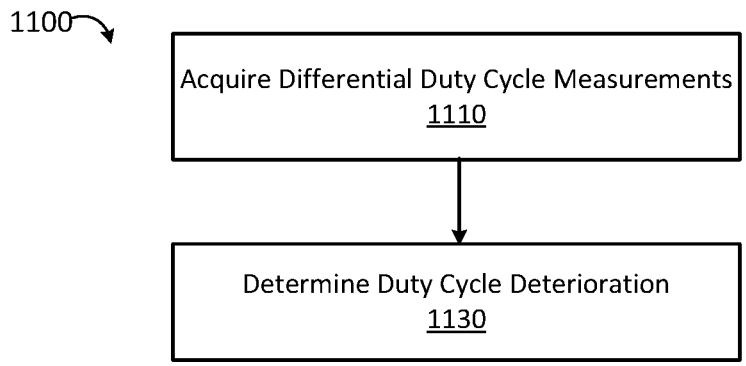
FIG. 11 is a flow diagram of another embodiment of a method for duty cycle measurement, analysis, and/or compensation.

FIG. 11 is a flow diagram of another embodiment of a method 1100 for duty cycle measurement, analysis, and/or compensation. Step 1110 may comprise acquiring differential duty cycle measurements 151 corresponding to a path 110, as disclosed herein. Step 1100 may comprise first acquiring duty cycle measurements 141A corresponding to a first propagation offset within the path 110. The first propagation offset may to an input region of the path 110 (e.g., be located at or near the input region 111 of the path 110). The first propagation offset may comprise and/or correspond to one or more of the propagation offsets 113A, 413A, 613A, 713A, and/or 813A, disclosed herein. Acquiring the duty cycle measurements 141A corresponding to the first propagation offset may comprise, inter alia, providing test input signal(s) to the path 110, connecting a measurement circuit to a selected position and/or location within the path 110 (the selected position and/or location corresponding to the first propagation offset e.g., position 112A, 412A, 612A, 712A, and/or 812A), and acquiring duty cycle measurements using the measurement circuit, as disclosed herein (e.g., in accordance with steps 1010, 1020, and/or 1030 of method 1000).

Acquiring the differential duty cycle measurements 151 at step 1110 may further comprise second acquiring duty cycle measurements 141N corresponding to a second propagation offset within the path 110. The second propagation offset may correspond to an output region of the path 110 (e.g., be located at or near the output region 117 of the path 110). The second propagation offset may comprise and/or correspond to one or more of the propagation offsets 113N, 413N, 613N, 713N, and/or 813N, disclosed herein. Acquiring the second duty cycle measurements 141N may comprise, inter alia, providing test input signal(s) to the path 110, connecting a measurement circuit to a selected position and/or location within the path 110 (the selected position and/or location corresponding to the second propagation offset e.g., position 112N, 412N, 612N, 712N, and/or 812N), and acquiring duty cycle measurements using the measurement circuit, as disclosed herein (e.g., in accordance with steps 1010, 1020, and/or 1030 of method 1000).

Step 1130 may comprise determining a duty cycle deterioration of the path 110 based on the duty cycle measurements corresponding to the first and second propagation offsets within the path. Step 1130 may comprise comparing and/or differencing the duty cycle measurements 141A to the duty cycle measurements 141N, as disclosed herein. Step 1130 may further comprising calculating a duty cycle error of the path 110 ($\Delta D_{E\_PATH}$) a duty cycle deterioration ($\Delta T_{E\_PATH}$) during propagation through the path 110, and/or the like. Step 1130 may comprise determining a DCDC 164 for the path 110 and/or deriving corresponding duty cycle correction data 166 to compensate for the determined DCDC 164. Step 1130 may further include configuring the circuit 100 to compensate for $\Delta D_{E\_PATH}$ and/or $\Delta T_{E\_PATH}$, which may comprise deriving duty cycle correction data 166 corresponding to the DCDC 164, and storing the duty cycle correction data 166 within the circuit 100 (e.g., recording the duty cycle correction data 166 in ROM fuse storage of the duty cycle adjust circuitry 108).

Figure 12:
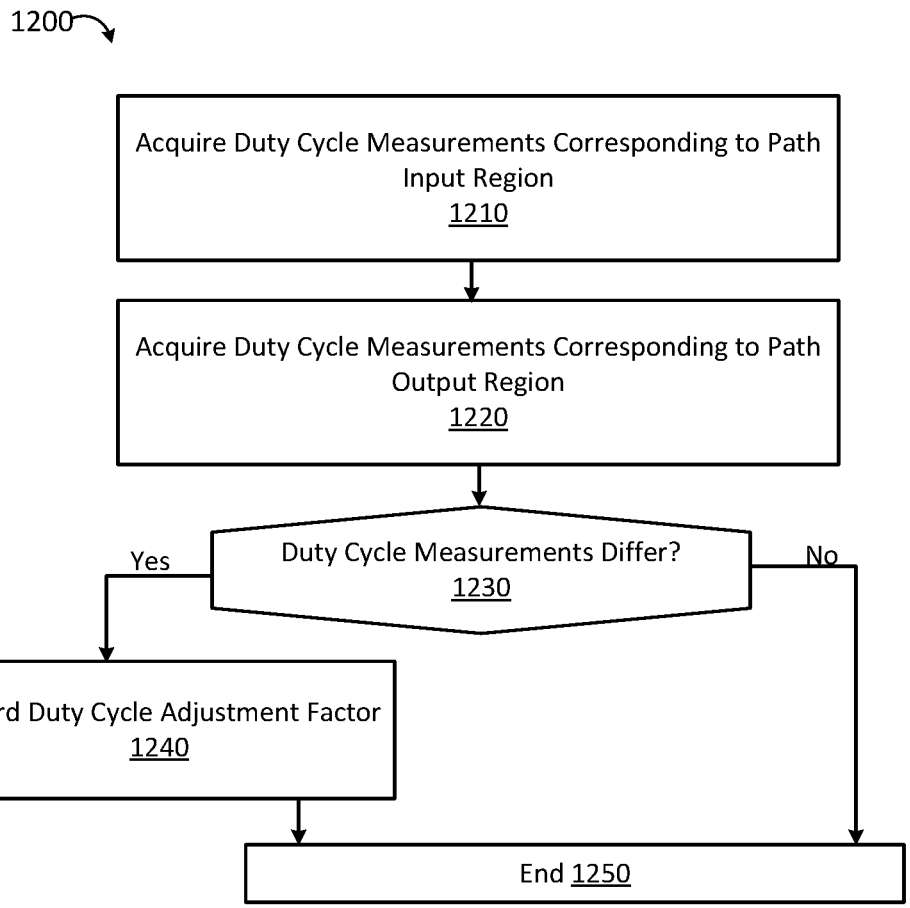
FIG. 12 is a flow diagram of another embodiment of a method for duty cycle measurement, analysis, and/or compensation.

FIG. 12 is a flow diagram of one embodiment of another method 1200 for duty cycle measurement, analysis, and/or compensation. Step 1210 may comprise acquiring duty cycle measurements 141A corresponding to an input region 111 of the path 110. The duty cycle measurements 141A may be acquired from a first path location 112 and/or propagation distance 113 (e.g., path location 112A, 412A, 612A, 712A, and/or 812A, as disclosed herein). The duty cycle measurements 141A may be acquired in accordance with step 1110 of method 1100 and/or steps 1010, 1020, and 1030 of method 1000, as disclosed above.

Step 1220 may comprise acquiring duty cycle measurements 141N corresponding to an output region 117 of the path 110. The duty cycle measurement 141N may be acquired at a second path location 112 and/or propagation distance 113 along the path 110 (e.g., path location 112N, 412N, 612N, 712N, and/or 812N, as disclosed herein). The duty cycle measurements 141N may be acquired in accordance with step 1110 of method 1100 and/or steps 1010, 1020, and 1030 of method 1000, as disclosed above.

The duty cycle measurements acquired at steps 1210 and 1220 may comprise differential duty cycle measurements 151, as disclosed herein. Step 1230 may comprise comparing the duty cycle measurements 141A to the duty cycle measurements 141N to determine whether the measurements 141A and 141N (and/or duty cycle metrics corresponding thereto) differ by more than a threshold. As disclosed above, the threshold may correspond to a duty cycle adjustment granularity of duty cycle adjust circuitry 108 (e.g., the adjust and/or trim size of the duty cycle adjust circuitry 108). If the duty cycle measurements 141A and 141N differ by more than the threshold, the flow may continue to step 1240; otherwise, the flow may end at step 1250.

Step 1240 may comprise determining a DCDC 164 for the path 110 using the measurements 141A and 141N, as disclosed herein. Step 1240 may further comprise determining duty cycle correction data 166 corresponding to the DCDC 164, as disclosed herein. The duty cycle correction data 166 may be adapted to configure duty cycle adjust circuitry 108 to compensate for the DCDC 164 measured within the path 110. Step 1240 may further comprise recording the duty cycle correction data 166 on more of more of the circuit, semiconductor 102, duty cycle adjust circuitry 108, and/or the like, such that the duty cycle adjust circuitry 108 is configured to implement the specified duty cycle corrections during operation of the circuit 100.

The subject matter described herein can be implemented in any suitable NANO flash memory, including 20 or 30 NANO flash memory. Semiconductor memory devices include volatile memory devices, such as dynamic random access memory ("DRAM") or static random access memory ("SRAM") devices, nonvolatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NANO or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NANO configuration (NANO memory) typically contain memory elements connected in series. A NANO memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NANO and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NANO memory array, the memory elements may be coupled together to form a NANO string within a single horizontal (e.g., x-z) memory device levels. Alternatively, the memory elements may be coupled together to form a vertical NANO string that traverses across multiple horizontal memory device levels. Other three dimensional configurations can be envisioned wherein some NANO strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that the subject matter described herein is not limited to the two dimensional and three dimensional exemplary structures described but cover all relevant memory structures within the spirit and scope of the subject matter as described herein and as understood by one of skill in the art.

The subject matter described herein may be implemented in hardware, software, firmware, or any combination thereof. As such, the terms "function" "node" or "module" as used herein refer to hardware, which may also include software and/or firmware components, for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It will be understood that various details of the subject matter described herein may be changed without departing from the scope of the subject matter described herein. Furthermore, the foregoing description is for the purpose of illustration only, and not for the purpose of limitation.

What is claimed is:

1. A circuit comprising a data path, the circuit further comprising:
    a first measurement circuit configured to acquire first duty cycle measurements from the data path;
    a second measurement circuit configured to acquire second duty cycle measurements from the data path; and
    a duty cycle adjust circuit;
    wherein the first measurement circuit and the second measurement circuit are communicatively coupled to different positions along the data path such that a difference between the first duty cycle measurements and the second duty cycle measurements corresponds to a duty cycle degradation along the data path; and
    the duty cycle adjust circuit is configured to adjust a duty cycle of a signal propagating through the data path based on the difference between the first duty cycle measurements and the second duty cycle measurements.

2. The circuit of claim 1, wherein:
the first measurement circuit is communicatively coupled to a first position along the data path, the first position configured such that the first duty cycle measurements correspond to an input duty cycle, and
the second measurement circuit is communicatively coupled to a second position along the data path, the second position configured such that the second duty cycle measurements correspond to an output duty cycle.

3. The circuit of claim 1, wherein the data path comprises input circuitry, and wherein the first measurement circuit is communicatively coupled to the input circuitry.

4. The circuit of claim 3, wherein the data path comprises data output circuitry, and wherein the second measurement circuit is communicatively coupled to the data output circuitry of the data path.

5. The circuit of claim 1, further comprising:
control circuitry configured to selectively couple one of the first measurement circuit and the second measurement circuit to an output pad,
wherein a test device is configured to receive duty cycle measurements through the output pad, the received duty cycle measurements including first duty cycle measurements and second duty cycle measurements, the test device further configured to determine a measure of the duty cycle degradation along the data path by use of the received duty cycle measurements, and to determine a duty cycle adjustment factor for the data path based on the measure of the duty cycle degradation.

6. The circuit of claim 1,
further comprising:
a Read Only Memory (ROM) configured to store a duty cycle adjust factor calculated from the difference between the first duty cycle measurements and the second duty cycle measurements.

7. The circuit of claim 1, wherein:
the first measurement circuit comprises first resistor capacitor (RC) circuitry,
the second measurement circuit comprises second RC circuitry,
the first duty cycle measurements comprise voltage potentials on the first RC circuitry while the first RC circuitry is communicatively coupled to a first position along the data path, and
the second duty cycle measurements comprise voltage potentials on the second RC circuitry while the second RC circuitry is communicatively coupled to a second position along the data path the second position different from the first position.

8. The circuit of claim 7, wherein the first RC circuitry and the second RC circuitry share a capacitor, the circuit further comprising:
control circuitry configured to selectively connect the shared capacitor to one of the first position along the data path and the second position along the data path.

9. The circuit of claim 8, wherein the control circuitry includes a first switch, comprising:
a metal-oxide-semiconductor (MOS) transistor having a source terminal connected to the first position along the data path, a drain terminal connected to the shared capacitor through a first resistor, and a gate terminal coupled to a first enable signal; and
a second transistor having a source terminal connected to the first position along the data path, a drain terminal connected to the shared capacitor through the first resistor, and a gate terminal coupled to an inverse of the first enable signal.

10. The circuit of claim 9, wherein the control circuitry includes a second switch, comprising:
a MOS transistor having a source terminal connected to the second position along the data path, a drain terminal connected to the shared capacitor through a second resistor, and a gate terminal coupled to a second enable signal; and
a second transistor having a source terminal connected to the second position along the data path, a drain terminal connected to the shared capacitor through the second resistor, and a gate terminal coupled to an inverse of the second enable signal.

11. A semiconductor device, comprising:
data output circuitry having a timing path, the data output circuitry is configured to communicate a timing signal along the timing path from an input region to an output region; and
a duty cycle measurement circuitry configured to measure a duty cycle error associated with the timing path, the duty cycle measurement circuitry including resistor capacitor (RC) circuitry having an input connected to a capacitive element of the RC circuitry through a resistive element of the RC circuitry, the duty cycle measurement circuitry configured to:
connect the input of the RC circuitry to the input region of the timing path to determine an input duty cycle metric corresponding to a duty cycle of the timing signal in the input region of the timing path, and
connect the input of the RC circuitry to the output region of the timing path to determine an output duty cycle metric corresponding to a duty cycle of the timing signal in the output region of the timing path,
wherein a difference between the input duty cycle metric and the output duty cycle metric comprises a measure of the duty cycle error associated with the timing path.

12. The semiconductor device of claim 11, wherein the duty cycle measurement circuitry is configured to acquire differential duty cycle measurements corresponding to the input duty cycle metric and the output duty cycle metric, and to provide the differential duty cycle measurements to a diagnostic device, wherein the diagnostic device determines a duty cycle adjustment to correct the measure of the duty cycle error associated with the timing path by use of the differential duty cycle measurements.

13. The semiconductor device of claim 12, wherein the diagnostic device writes the determined duty cycle adjustment to a storage location of the semiconductor device, the data output circuitry further comprising:
a duty cycle correction circuit configured to implement the determined duty cycle adjustment written to the storage location within the timing path.

14. The semiconductor device of claim 11, wherein the duty cycle measurement circuitry comprises an accumulator circuit having an input node and an output node, and wherein:
the input duty cycle metric corresponds to charge accumulated at the output node while the input node is coupled to the input region of the timing path, and
the output duty cycle metric corresponds to charge accumulated at the output node while the input node is coupled to the output region of the timing path.

15. The semiconductor device of claim 11, wherein
the input duty cycle metric corresponds to a voltage potential on the capacitive element while the input of the RC circuitry is connected to the input region of the timing path, and
the output duty cycle metric corresponds to a voltage potential on the capacitive element of the RC circuitry while the input of the RC circuitry is connected to the output region of the timing path.

16. The semiconductor device of claim 11, wherein the capacitive element comprises a node connected to a generator, and wherein the duty cycle measurement circuitry is configured to selectively disable the generator.

17. The semiconductor device of claim 11, wherein the duty cycle measurement circuitry comprises:
a first capacitor; and
a second capacitor, wherein:
the input duty cycle metric corresponds to a voltage potential on the first capacitor while the first capacitor is connected to a first location on the timing path, the first location within the input region of the timing path, and
the output duty cycle metric corresponds to a voltage potential on the second capacitor while the second capacitor is coupled to a second location on the timing path, the second location within the output region of the timing path.

18. The semiconductor device of claim 17, wherein:
the first capacitor and the second capacitor comprise a common capacitive element,
the first input circuitry is configured to selectively connect the first location on the timing path to the common capacitive element,
the second input circuitry is configured to selectively connect the second location on the timing path to the common capacitive element,
the input duty cycle metric corresponds to a voltage potential on the common capacitive element while the common capacitive element is connected to the first position of the timing path and is disconnected from the second position of the timing path, and
the output duty cycle metric corresponds to a voltage potential on the common capacitive element while the common capacitive element is connected to the second position of the timing path and is disconnected from the first position of the timing path.

19. A method, comprising:
acquiring first measurements corresponding to a duty cycle of an input signal being propagated through a data path, wherein acquiring the first measurements comprises:
connecting an input of a resistor-capacitor (RC) circuit at a first propagation distance within the data path, the input connected to receive a first time-variant signal, the first time-variant signal corresponding to propagation of the input signal through the first propagation distance within the data path, and
acquiring first voltage potential measurements on an output of the RC circuit while the input of the RC circuit is connected at the first propagation distance along the data path;
acquiring second measurements corresponding to the duty cycle of the input signal being propagated through the data path, wherein acquiring the second measurements comprises:
connecting the input of the RC circuit at a second propagation distance along the data path, the input connected to receive a second time-variant signal, the second time-variant signal corresponding to propagation of the input signal through the second propagation distance within the data path, the second propagation distance larger than the first propagation distance, and
acquiring second voltage potential measurements on the output of the RC circuit while the input of the RC circuit is connected at the second propagation distance along the data path; and
determining a duty cycle correction for the data path based on a difference between the first voltage potential measurements and the second voltage potential measurements.

20. A system, comprising:
means for measuring a first voltage potential on a capacitor while an input of the capacitor is connected to a first location along a data path of data output circuitry, the first location comprising a first oscillating signal formed in response to propagating a signal from an input to the data path to the first location along the data path;
means for measuring a second voltage potential on the capacitor while the input of the capacitor is connected to a second location along the data path of the data output circuitry, the second location comprising a second oscillating signal formed in response to propagating the signal from the input to the data path to the second location along the data path, the second location different from the first location;
means for determining a duty cycle correction for the data path, the duty cycle correction corresponding to a difference between the first voltage potential and the second voltage potential and
means for adjusting duty cycle of a signal propagating through the data path based on the duty cycle correction for the data path.

* * * * *